US012363917B2

(12) United States Patent
Takahashi

(10) Patent No.: US 12,363,917 B2
(45) Date of Patent: Jul. 15, 2025

(54) MEMORY DEVICE

(71) Applicant: KIOXIA CORPORATION, Tokyo (JP)

(72) Inventor: Kensuke Takahashi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 424 days.

(21) Appl. No.: 17/901,744

(22) Filed: Sep. 1, 2022

(65) Prior Publication Data

US 2023/0301119 A1 Sep. 21, 2023

(30) Foreign Application Priority Data

Mar. 18, 2022 (JP) .................................. 2022-044021

(51) Int. Cl.
*H10B 63/00* (2023.01)
*H10N 70/00* (2023.01)
*H10N 70/20* (2023.01)

(52) U.S. Cl.
CPC ........... *H10B 63/845* (2023.02); *H10B 63/30* (2023.02); *H10N 70/253* (2023.02); *H10N 70/826* (2023.02)

(58) Field of Classification Search
CPC ...... H10B 63/845; H10B 63/30; H10B 63/10; H10B 63/84; H10B 63/34; H10N 70/253;
(Continued)

(56) References Cited

U.S. PATENT DOCUMENTS 8,436,331 B2  5/2013 Iwakaji
9,093,370 B2  7/2015 Hwang
(Continued)

FOREIGN PATENT DOCUMENTS

JP  2008160004 A   7/2008
JP  5481565 B2     4/2014
TW  I556432 B     11/2016

OTHER PUBLICATIONS

K. Kurotsuchi et al., "2.8-GB/s-write and 670-MB/s-erase operations of a 3D vertical chain-cell-type phase-change-memory array", Symposium on VLSI Technology Digest of Technical Papers, 2015, 2 pages.

(Continued)

*Primary Examiner* — Allison Bernstein
(74) *Attorney, Agent, or Firm* — Kim & Stewart LLP

(57) ABSTRACT

According to one embodiment, a memory device includes a first conductor layer and a second conductor layer spaced apart from each other in a first direction, a first semiconductor film spaced from the first conductor layer in a second direction intersecting the first direction, and a second semiconductor film spaced from the second conductor layer in the second direction. The first semiconductor film is between a first resistance change film and the first conductor layer in the second direction. The second semiconductor film is between a second resistance change film and the second conductor layer in the second direction. A first conductor film has a first end contacting the first semiconductor film and the first resistance change film and a second end contacting the second semiconductor film and the second resistance change film.

20 Claims, 22 Drawing Sheets

(58) Field of Classification Search
CPC ............... H10N 70/826; H10N 70/231; H10N 70/8828; G11C 8/08; G11C 7/12
See application file for complete search history.

(56) References Cited

U.S. PATENT DOCUMENTS

| | | | |
|---|---|---|---|
| 9,153,774 | B2 | 10/2015 | Sasago et al. |
| 9,343,672 | B2 | 5/2016 | Park |
| 9,450,026 | B2 | 9/2016 | Tajima |
| 10,283,710 | B2* | 5/2019 | Kikuchi ............... H10N 70/023 |
| 10,381,559 | B1* | 8/2019 | Zhou ................... H10N 70/841 |
| 2008/0149913 | A1 | 6/2008 | Tanaka et al. |
| 2013/0200331 | A1 | 8/2013 | Morikawa et al. |
| 2013/0228739 | A1 | 9/2013 | Sasago et al. |
| 2015/0270312 | A1 | 9/2015 | Tajima |

OTHER PUBLICATIONS

Ken Kurosaki, "Development of Modulation Dope High Efficiency Bulk Nanosilicon Thermoelectric Material", Japanese Science and Technology Agency, Research Report, 2018, 16 pages. Retrieved from: https://projectdb.jst.go.jp/file/JST-PROJECT-15665196/JST_1112071_15665196_2018_%E9%BB%92%E5%B4%8E_PER.pdf.

M. Kinoshita et al., "Scalable 3-D vertical chain-cell-type phase-change memory with 4F2 poly-Si diodes", Symposium on VLSI Technology Digest of Technical Papers, 2012, pp. 35-36.

Preeyakarn Eaksuwanchai et al., "Thermoelectric properties of Si-Nisi2 bulk nanocomposites synthesized by a combined method of melt spinning and spark plasma sintering", Journal of Applied Physics, 121, 225110, 2017, 6 pages. Retrieved from: https://doi.org/10.1063/1.4985283.

* cited by examiner

MEMORY DEVICE

CROSS-REFERENCE TO RELATED APPLICATION(S)

This application is based upon and claims the benefit of priority from Japanese Patent Application No. 2022-044021, filed Mar. 18, 2022, the entire contents of which are incorporated herein by reference.

FIELD

Embodiments described herein relate generally to a memory device.

BACKGROUND

A resistance change memory is known as a memory device capable of storing data in a non-volatile manner. A three-dimensional memory structure is being studied to increase integration and capacity of a memory device such as a resistance change memory.

DETAILED DESCRIPTION

Figure 1:
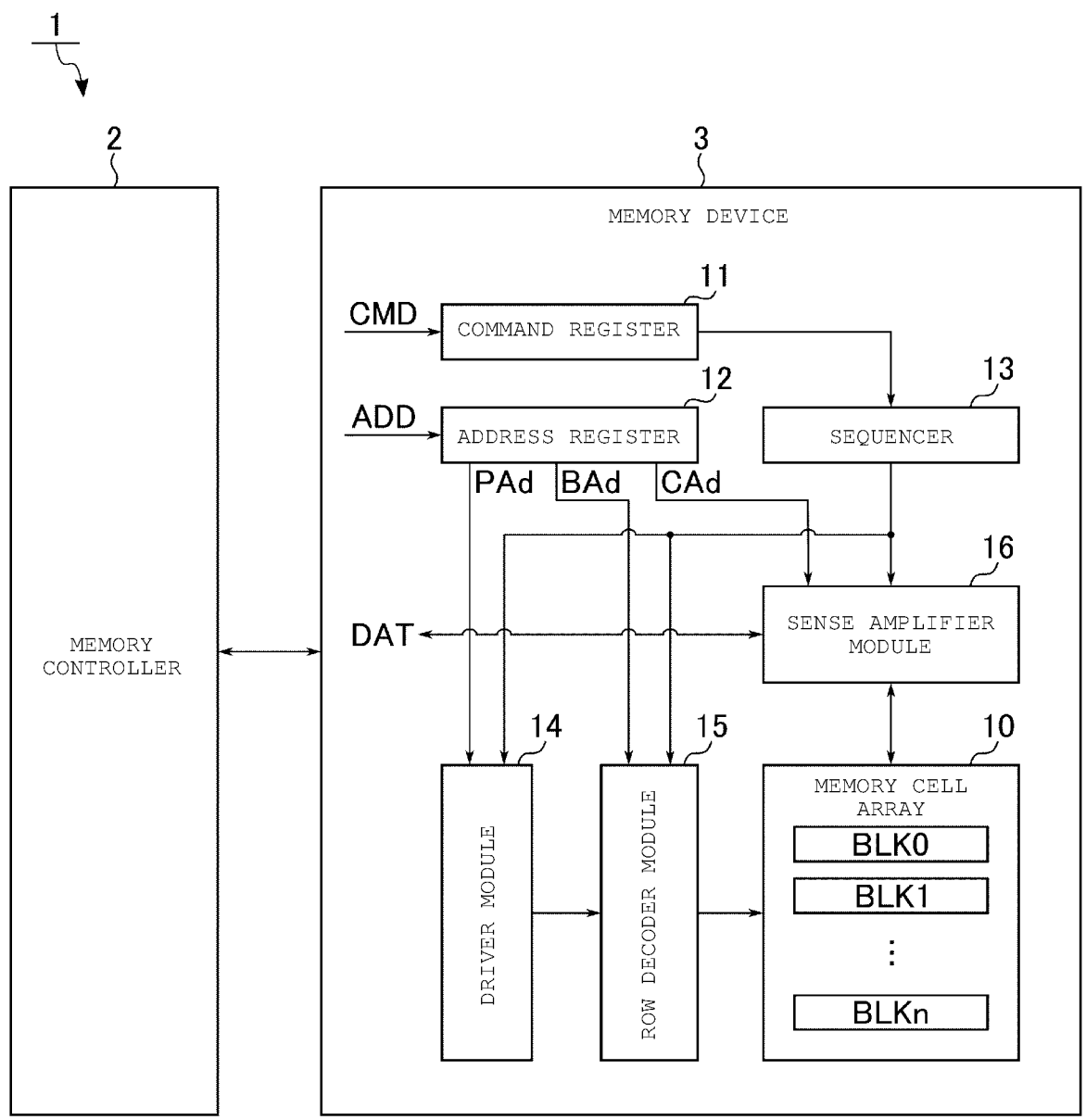
FIG. 1 is a block diagram of a memory system including a memory device according to an embodiment.

Embodiments provide memory cells with improved characteristics.

In general, according to one embodiment, a memory device includes a first conductor layer, a second conductor layer, a first semiconductor film, a second semiconductor film, a first resistance change film, a second resistance change film, and a first conductor film. The first conductor layer and the second conductor layer are spaced apart from each other in a first direction intersecting a substrate plane. The first semiconductor film is separated from the first conductor layer in a second direction intersecting the first direction. The second semiconductor film is separated from the second conductor layer in the second direction. The first resistance change film is separated from the first conductor in the second direction. The first semiconductor film is between the first resistance change film and the first conductor layer in the second direction. The second resistance change film is separated from the second conductor in the second direction. The second semiconductor film is between the second resistance change film and the second conductor layer in the second direction. The first conductor film has a first end in contact with the first semiconductor film and the first resistance change film and a second end in contact with the second semiconductor film and the second resistance change film.

Hereinafter, certain example embodiments will be described with reference to the drawings. Dimensions and proportions of the drawings are not always the same as actual dimensions and proportions.

In the following description, components having substantially the same function and configuration are designated by the same reference symbols. When particularly distinguishing elements having the same configuration as each other having the same reference numeral, different letters or numbers may be added to an end of the base reference numeral.

1. Embodiment

1.1 Configuration

1.1.1 Memory System

FIG. 1 is a block diagram illustrating an example of a configuration of a memory system including a memory device according to an embodiment. A memory system 1 is a storage device configured to be connected to an external host apparatus. The memory system 1 is, for example, a memory card such as an SD™ card or a solid-state drive (SSD). The memory system 1 includes a memory controller 2 and a memory device 3.

The memory controller 2 is composed of, for example, an integrated circuit such as a system-on-a-chip (SoC). The memory controller 2 controls the memory device 3 based on a request from the host apparatus. Specifically, for example, the memory controller 2 writes data requested to be written by the host apparatus to the memory device 3. Further, the memory controller 2 reads out data requested to be read out from the host apparatus from the memory device 3 and transmits the read-out data to the host apparatus.

The memory device 3 is a non-volatile memory. The memory device 3 is, for example, a phase change random access memory (PCRAM). The memory device 3 stores data in a non-volatile manner.

Communication between the memory controller 2 and the memory device 3 is based on, for example, a single data rate (SDR) interface, a toggle double data rate (DDR) interface, or an open NAND flash interface (ONFI).

1.1.2 Memory Device

Subsequently, an internal configuration of a memory device according to an embodiment will be described with reference to the block diagram illustrated in FIG. 1. The memory device 3 includes, for example, a memory cell array 10, a command register 11, an address register 12, a sequencer 13, a driver module 14, a row decoder module 15, and a sense amplifier module 16.

The memory cell array 10 includes n+1 (where n is an integer of 1 or more) blocks BLK0 to BLKn. The number of blocks BLK provided in the memory cell array 10 may be one. The block BLK is a set of a plurality of memory cells. The memory cells store data in a non-volatile manner. The memory cell array 10 is provided with a plurality of bit lines and a plurality of word lines. Each memory cell is associated with, for example, one bit line and one word line.

The command register 11 stores a command CMD received by the memory device 3 from the memory controller 2. The command CMD includes, for example, a command for causing the sequencer 13 to perform a read operation, a write operation, an erase operation, and the like.

The address register 12 stores address information ADD received by the memory device 3 from the memory controller 2. The address information ADD includes, for example, a block address BAd, a page address PAd, and a column address CAd. For example, the block address BAd, the page address PAd, and the column address CAd are used to respectively select the block BLK, a word line, and a bit line.

The sequencer 13 controls all operations of the memory device 3. For example, the sequencer 13 controls the driver module 14, the row decoder module 15, the sense amplifier module 16, and the like to perform a read operation, a write operation, and the like, based on the command CMD stored in the command register 11.

The driver module 14 generates a voltage used for a read operation, a write operation, and the like. Then, the driver module 14 applies a generated voltage to a signal line corresponding to the selected word line, for example, based on the page address PAd stored in the address register 12.

The row decoder module 15 selects one block BLK in the corresponding memory cell array 10 based on the block address BAd stored in the address register 12. Then, the row decoder module 15 transfers, for example, a voltage applied to a signal line corresponding to a selected word line to the selected word line in a selected block BLK.

During a write operation, the sense amplifier module 16 applies a desired voltage to each bit line according to write data DAT received from the memory controller 2. Further, during a read operation, the sense amplifier module 16 determines data stored in a memory cell based on a voltage of a bit line and transfers a determination result to the memory controller 2 as the read-out data DAT.

1.1.3 Circuit Configuration of Memory Cell Array

Figure 2:
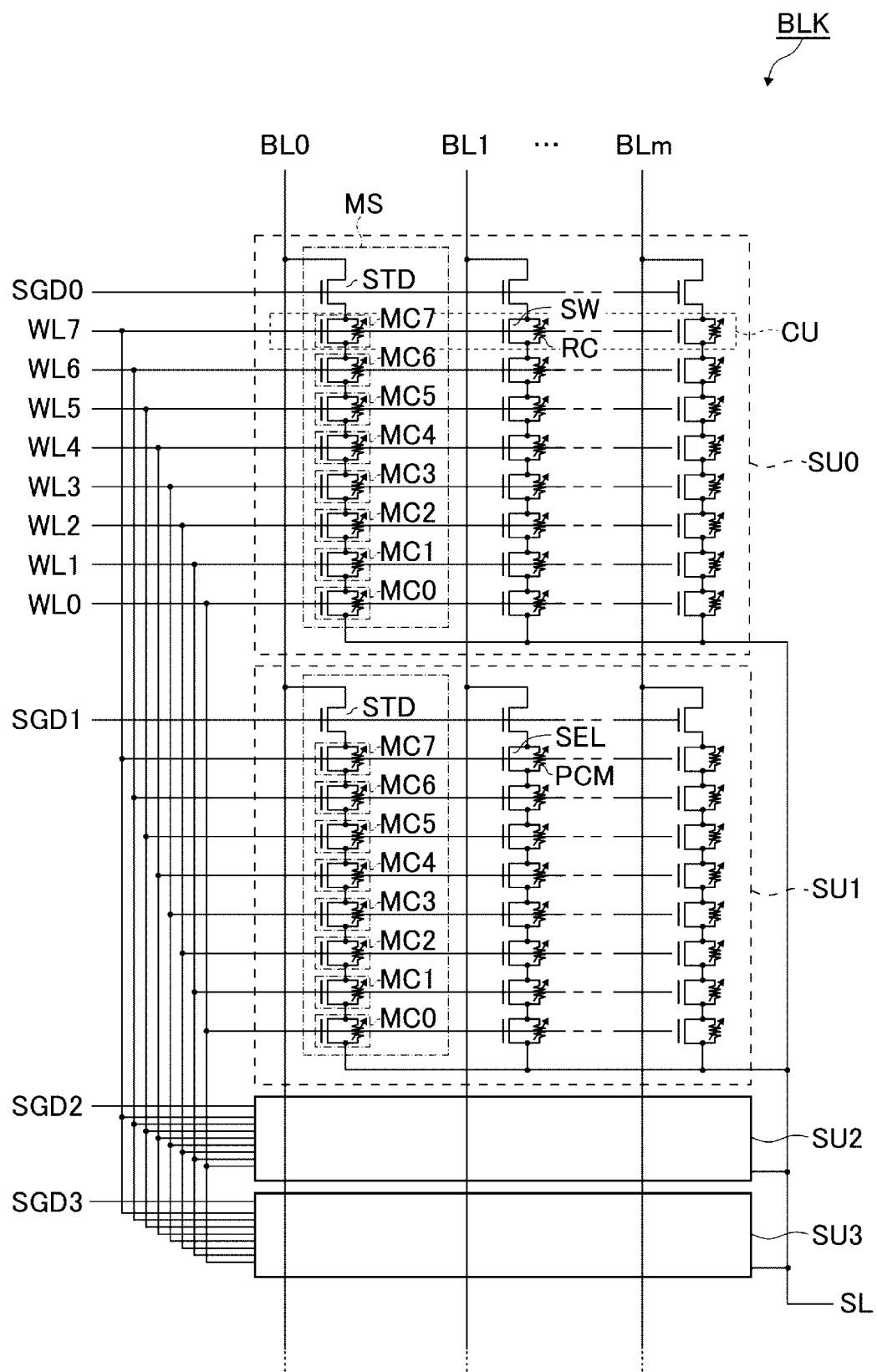
FIG. 2 is a circuit diagram of a memory cell array of a memory device according to an embodiment.

FIG. 2 is a circuit diagram illustrating an example of a circuit configuration of a memory cell array provided in a memory device according to an embodiment. FIG. 2 illustrates one block BLK of a plurality of blocks BLK provided in the memory cell array 10. As illustrated in FIG. 2, the block BLK includes, for example, four string units SU0 to SU3.

Each string unit SU includes a plurality of memory strings MS respectively associated with bit lines BL0 to BLm (where m is an integer of 1 or more). The number of bit lines BL may be one. Each of the memory strings MS includes, for example, memory cells MC0 to MC7 and a select transistor STD. In each of the memory strings MS, the select transistor STD and the memory cells MC0 to MC7 are connected in series.

Specifically, a first terminal of the select transistor STD is connected to a corresponding bit line BL. A second terminal of the select transistor STD is connected to a first terminal of the memory cell MC7. A second terminal of the memory cell MC7 is connected to a first terminal of the memory cell MC6. Hereinafter, similarly for an integer i greater than or equal to 1 but less than or equal to 6, a second terminal of the memory cell MCi is connected to a first terminal of the memory cell MC(i-1). A second terminal of the memory cell MC0 is connected to a source line SL.

Each of the memory cells MC includes a switching element SW and a resistance change element RC. The switching element SW and the resistance change element RC in the same memory cell MC are connected in parallel to the adjacent memory cell MC. In particular, a first terminal of the switching element SW of the memory cell MC7 and a first terminal of the resistance change element RC thereof are commonly connected to the second terminal of the select transistor STD. A second terminal of the switching element SW of the memory cell MC7 and a second terminal of the resistance change element RC thereof are commonly connected to a first terminal of a switching element SW of the memory cell MC6 and a first terminal of the resistance change element RC thereof. Similarly, for any integer i greater than or equal to 1 but less than or equal to 6, a second terminal of a switching element SW of a memory cell MCi and a second terminal of a resistance change element RC thereof are commonly connected to a first terminal of a switching element SW of a memory cell MC(i-1) and a first terminal of a resistance change element RC thereof. A second terminal of the switching element SW of the memory cell MC0 and a second terminal of the resistance change element RC thereof are commonly connected to the source line SL.

The resistance change element RC is an element capable of reversibly transitioning between a low resistance state and a high resistance state by changing a crystal state. A resistance value of the resistance change element RC in a low resistance state is, for example, at least 10 times (i.e., at least one order of magnitude) larger than a resistance value of a channel in an ON state of the switching element SW. Accordingly, in a memory cell MC, when the switching element SW of the memory cell MC is in an ON state, almost no current flows through the resistance change element RC of the memory cell MC. The resistance value of the resistance change element RC in a high resistance state is, for example, no more than 0.1 times (i.e., at least one order of magnitude smaller than) the resistance value of a channel in an OFF state of the switching element SW. Accordingly, in a memory cell MC, when the switching element SW of the memory cell MC is in an OFF state, a significant current flows through the resistance change element RC of the memory cell MC. Hereinafter, a change in a crystal state of the resistance change element RC is referred to as a "phase change". When the resistance change element RC is in a low resistance state or a high resistance state. The low resistance state and the high resistance state are also referred to, respectively, as a "set state" and a "reset state".

In the same block BLK, a control terminal of the switching element SW of the memory cell MC0 to a control terminal of the switching element SW of the memory cell MC7 are respectively connected to the word lines WL0 to WL7. The control terminals of the select transistors STD in the string units SU0 to SU3 are respectively connected to select gate lines SGD0 to SGD3.

Different column addresses are assigned to the bit lines BL0 to BLm. Each bit line BL is shared by a memory string MS to which the same column address is assigned among the plurality of blocks BLK. The word lines WL0 to WL7 are provided for each of the blocks BLK. The source line SL is shared, for example, between the plurality of blocks BLK.

A set including the plurality of memory cells MC connected to a common word line WL in one string unit SU is referred to as, for example, a cell unit CU. For example, storage capacity of the cell unit CU including the memory cell MC, each storing 1-bit data, is defined as "1 page data". The cell unit CU may have storage capacity of two pages or more data according to the number of bits of data stored in the memory cell MC.

A circuit configuration of the memory cell array 10 provided in the memory device 3 according to the embodiment is not limited to the configuration described above. For example, the number of string units SU provided in each block BLK may be freely designed. The number of memory cells MC and select transistors STD provided in each memory string MS may be freely designed.

1.1.4 Layout of Memory Cell Array

Next, an example of a layout of a memory cell array of a memory device according to an embodiment will be described.

In the drawings referred to below, the X direction corresponds to an extension direction of the word line WL. The Y direction corresponds to an extension direction of the bit line BL. The Z direction corresponds to a direction perpendicular to a surface of a semiconductor substrate used to form the memory device 3. Hatching may be appropriately added to make the aspects of the figures easier to see. The hatching added is not always related to any difference in material or properties of a component to which the hatching is added.

Figure 3:
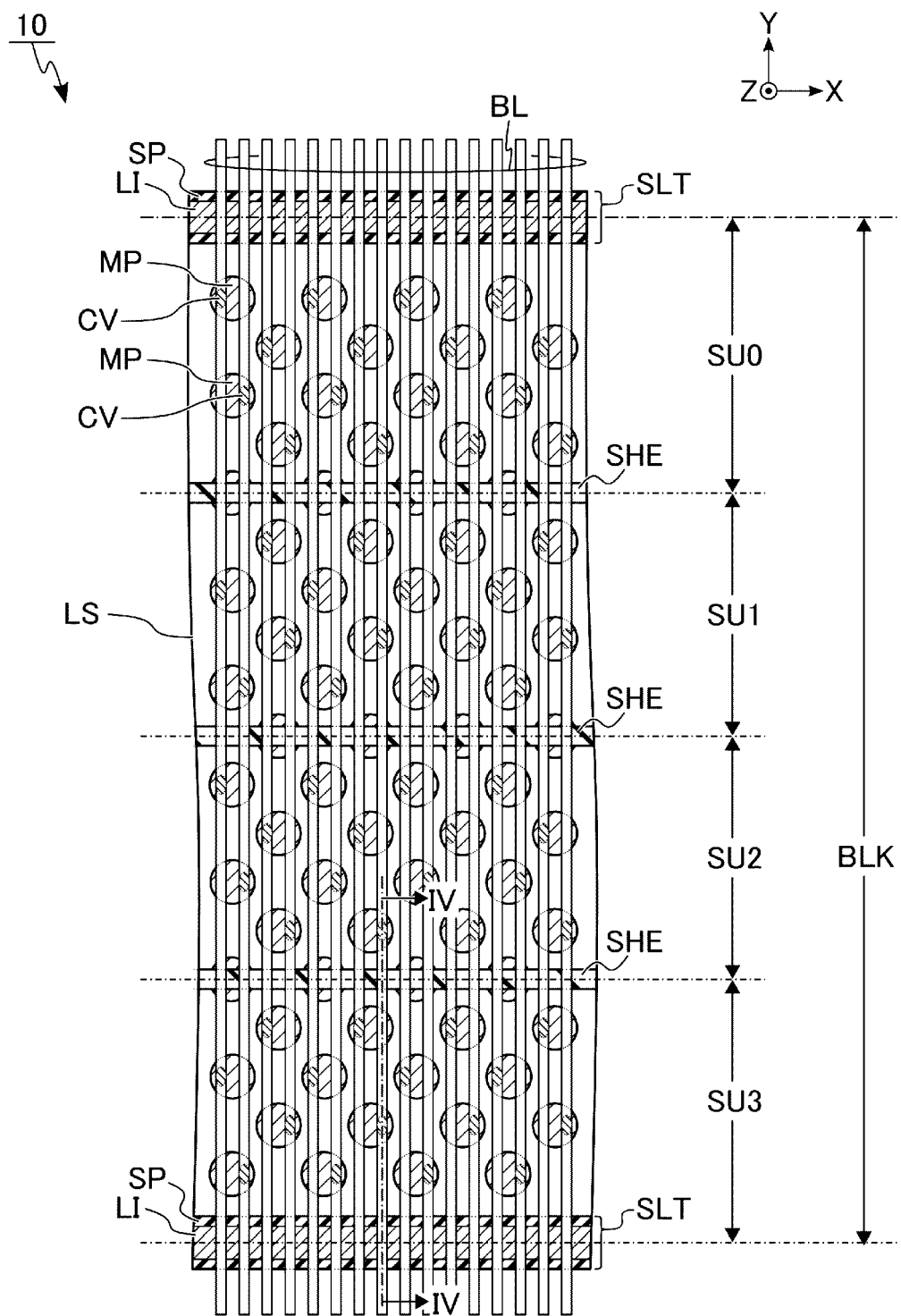
FIG. 3 is a plan view illustrating a plan layout of a memory cell array of a memory device according to an embodiment.

FIG. 3 is a plan view illustrating an example of a plan layout of a memory cell array of a memory device according to an embodiment. In FIG. 3, a region including one block BLK (including string units SU0 to SU3) is illustrated. As illustrated in FIG. 3, the memory cell array 10 includes a stack wiring structure LS, a plurality of memory pillars MP, a plurality of members SLT, a plurality of members SHE, a plurality of contacts CV, and a plurality of bit lines BL.

The stack wiring structure LS is a structure in which a plurality of wires are stacked spaced apart from each other in the Z direction. The plurality of wires in the stack wiring structure LS include the word lines WL0 to WL7, and the select gate line SGD. The stack wiring structure LS is divided into a plurality of portions which are arranged in the Y direction. Each of the portions of the stack wiring structure LS corresponds to one block BLK.

Each of the members SLT has a plate-shaped structure parallel to an XZ plane. The plurality of members SLT are arranged in the Y direction. Each of the members SLT extends in the X direction at a boundary region between adjacent pairs of blocks BLK. In particular, each of the members SLT divides the adjacent stack wiring structures LS via a corresponding member SLT.

Each of the members SLT includes a contact LI and a spacer SP. The contact LI is a conductor film that extends in the XZ plane. The spacer SP is an insulator film provided on a side surface of the contact LI. In other words, the contact LI is surrounded by the spacer SP in plan view.

Each of the plurality of members SHE has a plate-shaped structure parallel to the XZ plane. The plurality of members SHE are arranged in the Y direction. In the example of FIG. 3, three members SHE are arranged between adjacent members SLT. Each of the members SHE extends in the X direction. Each of the members SHE divides the select gate line SGD among the stack wiring structures LS adjacent to each other via a corresponding member SHE.

Each of the plurality of memory pillars MP functions as, for example, one memory string MS. The plurality of memory pillars MP are arranged, for example, in a zigzag pattern of 19 rows in a region between two adjacent members SLT. Then, one member SHE overlaps each of the memory pillar MP in the fifth row, the memory pillar MP in the tenth row, and the memory pillar MP in the fifteenth row, for example, counting from an upper side of a drawing sheet.

The plurality of bit lines BL extend in the Y direction and are arranged in the X direction. The bit lines BL overlap at least one memory pillar MP in each string unit SU. The example of FIG. 3 illustrates a case where two bit lines BL overlap one memory pillar MP. The memory pillar MP is electrically connected to one of the plurality of bit lines BL overlapping the memory pillar MP via the contact CV.

The contact CV between the memory pillar MP in contact with the member SHE and the bit line BL is omitted from the depiction. In other words, the contact CV between the memory pillar MP in contact with two different select gate lines SGD and the bit line BL is omitted.

The number and arrangement of the memory pillars MP, the members SHE, and the like between the adjacent members SLT are not limited to the configuration described with reference to FIG. 3 and may be changed as appropriate. The number of bit lines BL overlapping the memory pillars MP may be freely designed.

1.1.5 Cross-Sectional Structure of Memory Cell Array

Figure 4:
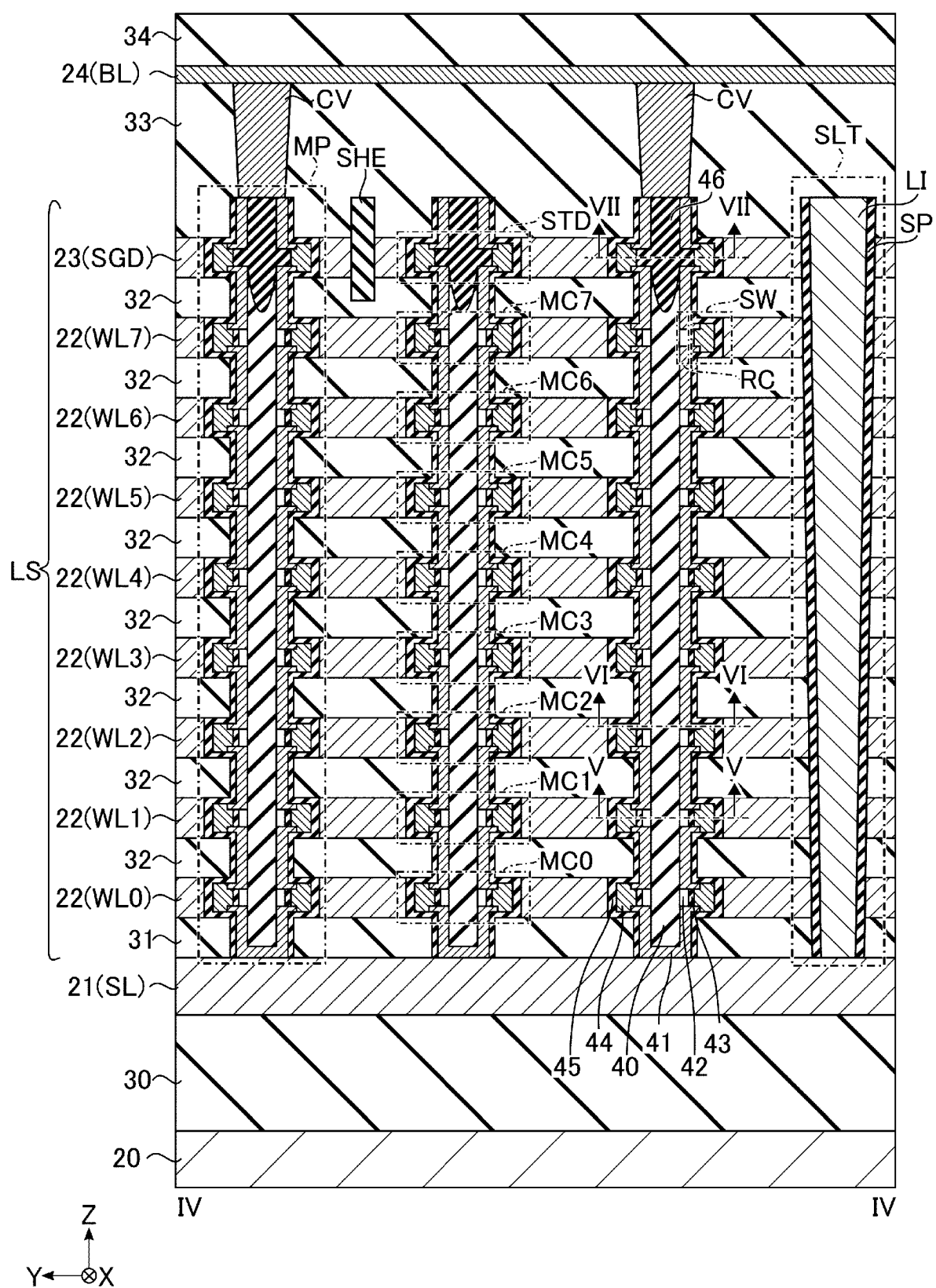
FIG. 4 is a cross-sectional view of a memory cell array of a memory device according to an embodiment.

FIG. 4 is a cross-sectional view taken along line IV-IV of FIG. 3 and illustrating an example of a cross-sectional structure of a memory cell array of a memory device according to an embodiment. As illustrated in FIG. 4, the memory cell array 10 further includes a semiconductor substrate 20, conductor layers 21 to 24, and insulator layers 30 to 34. The insulator layers 30 to 34 include, for example, silicon oxide.

The semiconductor substrate 20 is, for example, a P-type semiconductor. The insulator layer 30 is provided on an upper surface of the semiconductor substrate 20. A circuit is provided on the semiconductor substrate 20 and the insulator layer 30. The circuits provided on the semiconductor substrate 20 and the insulator layer 30 correspond to the row decoder module 15, the sense amplifier module 16, and the like.

The conductor layer 21 is provided on an upper surface of the insulator layer 30. The conductor layer 21 is, for example, a plate-shaped conductor extending along an XY plane. The conductor layer 21 is used as the source line SL. The conductor layer 21 includes, for example, phosphorus-doped silicon. The insulator layer 31 is provided on an upper surface of the conductor layer 21.

The conductor layer 22 and the insulator layer 32 are alternately stacked over the upper surface of the insulator layer 31. The conductor layer 22 is, for example, a plate-shaped conductor extending along the XY plane. The plurality of stacked conductor layers 22 sequentially arranged from the semiconductor substrate 20 side are respectively used as the word lines WL0 to WL7. The conductor layers 22 include, for example, tungsten.

The conductor layer 23 is provided on an upper surface of the uppermost insulator layer 32. The conductor layer 23 is, for example, a plate-shaped conductor extending along the XY plane. The conductor layer 23 is used as the select gate line SGD. The conductor layer 23 includes, for example, tungsten. The insulator layer 33 is provided on an upper surface of the conductor layer 23.

The conductor layer 24 is provided on an upper surface of the insulator layer 33. The conductor layer 24 is, for example, a line-shaped conductor extending in the Y direction. The conductor layer 24 is used as the bit line BL. In another region, a plurality of conductor layers 24 can be arranged in the X direction. The conductor layer 24 includes, for example, copper. Then insulator layer 34 is provided on an upper surface of the conductor layer 24.

The plurality of memory pillars MP penetrates the insulator layers 31 and 32 and the conductor layers 22 and 23. Each of the memory pillars MP extends in the Z direction. A bottom of each of the memory pillars MP reaches the conductor layer 21. A portion where the memory pillar MP and a conductor layer 22 intersect each other functions as one memory cell MC. The portion where the memory pillar MP and the conductor layer 23 intersect functions as the select transistor STD.

Each of the memory pillars MP includes, for example, a core film 40, a conductor film 41, a resistance change film 42, an insulator film 43, a semiconductor film 44, an insulator film 45, and a core film 46.

The core film 40 extends in the Z direction. An upper end of the core film 40 is located between the uppermost conductor layer 22 and the conductor layer 23. A lower end of the core film 40 is located between the lowermost conductor layer 22 and the conductor layer 21. The core film 40 includes, for example, silicon nitride.

The core film 46 is provided on an upper surface of the core film 40. An upper end of the core film 46 is located above the conductor layer 23. The core film 46 includes, for example, silicon oxide.

The resistance change film 42 covers a portion of a side surface of the core film 40 which intersects the conductor layers 22. The resistance change film 42 is divided into a plurality of portions each of which is provided at a location corresponding to one of the conductor layers 22 (one word line WL layer). An upper surface of the portion of the resistance change film 42 provided at a location corresponding to a conductor layer 22, but the upper surface of the portion is located below (at a lower height than) an upper surface of the corresponding conductor layer 22. Similarly, a lower surface of the portion of the resistance change film 42 provided at the location corresponding to the particular conductor layer 22 is located above (at greater height than) a lower surface of the corresponding conductor layer 22.

The resistance change film 42 is an alloy type phase change material including at least two elements selected from germanium (Ge), antimony (Sb), and tellurium (Te) as main components. The resistance change film 42 may include an additive element such as indium (In) in an amount of 10% or less in addition to the main components. A portion of the resistance change film 42 provided at a location intersecting the conductor layer 22 functions as a resistance change element RC of the memory cell MC intersecting the conductor layer 22.

The insulator film 43 covers a side surface of the resistance change film 42. The insulator film 43 is divided into a plurality of portions each of which is provided at a location corresponding to one of the conductor layers 22 (one word line WL layer). An upper surface of the portion of the insulator film 43 is at a location corresponding to the conductor layer 22 (is at the same height as a portion of the conductor layer 22), but is located below (at a lower height than) an upper surface of the conductor layer 22. A lower surface of the portion of the insulator film 43 is at a location corresponding to the conductor layer 22 (is at the same height as a portion of the conductor layer 22), but is located above (at a greater height than) a lower surface of the conductor layer 22. The insulator film 43 includes silicon oxide.

The semiconductor film 44 comprises, for example, polysilicon. The semiconductor film 44 covers a side surface of the insulator film 43 and a portion of the side surface of the core film 46 that intersects with the conductor layer 23. The semiconductor film 44 is divided into a portion provided at a location corresponding in position (height) with the conductor layer 23 and a plurality of portions, each of which is provided at a location corresponding in position (height) with a conductor layer 22 of one layer (one word line WL layer).

An upper surface of a portion of the semiconductor film 44 is located below (at lower height than) an upper surface of the corresponding conductor layer 22. A lower surface of a portion of the semiconductor film 44 is located above (at a greater Neigh than) a lower surface of the corresponding conductor layer 22. The portions of the semiconductor film 44 corresponding in position (height) with the conductor layer 22 functions as a channel of the switching element SW of the memory cell MC provided at the location intersecting the conductor layer 22.

An upper surface of a portion of the semiconductor film 44 provided corresponding to the conductor layer 23 is located below (at a lower height than) an upper surface of the conductor layer 23. A lower surface of a portion of the semiconductor film 44 provided corresponding to the conductor layer 23 is located above (at a greater height than) a lower surface of the conductor layer 23. The portion of the semiconductor film 44 corresponding to conductor layer 23 functions as a channel of the select transistor STD.

The conductor film 41 is a metal film that covers a portion of the side surface of the core film 46 that is not covered by the semiconductor film 44, a portion of side surface of the core film 40 that is not covered by the resistance change film, as well as a lower end surface of the core film 40. The conductor film 41 includes, for example, nickel silicide (NiSi) or nickel disilicide ($NiSi_2$). The conductor film 41 is divided into: a portion below the lowermost conductor layer 22, a portion between two adjacent conductor layers 22, a portion between the uppermost conductor layer 22 and the conductor layer 23, and a portion above the conductor layer 23.

A lower end of the portion of the conductor film 41 below the lowermost conductor layer 22 is in contact with the conductor layer 21. An upper end of the portion of the conductor film 41 below the lowermost conductor layer 22 is in contact with a lower end of a portion of the resistance change film 42 and a portion of the semiconductor film 44 which are provided for the lowermost conductor layer 22. Thereby, the upper end of the portion of the conductor film 41 below the lowermost conductor layer 22 can be Schottky-bonded to a lower end of the portion of the semiconductor film 44 provided for the lowermost conductor layer 22.

The lower end of the portion of the conductor film 41 between the two adjacent conductor layers 22 is in contact with upper ends of the portion of the resistance change film 42 and the portion of the semiconductor film 44 corresponding to the lower one of the two conductor layers 22. Thereby, the lower end of the portion of the conductor film 41 between the two adjacent conductor layers 22 can be Schottky-bonded to an upper end of the portion of the semiconductor film 44 for the lower conductor layer 22 (of the two conductor layers 22). An upper end of the portion of the conductor film 41 between the two adjacent conductor layers 22 is in contact with a lower end of the portion of the resistance change film 42 and the portion of the semiconductor film 44 provided for an upper one of the two conductor layers 22. Thereby, the upper end of the portion of the conductor film 41 between the two adjacent conductor layers 22 can be Schottky-bonded to the lower end of the portion of the semiconductor film 44 provided for the upper conductor layer 22 (of the two conductor layers 22).

A lower end of a portion of the conductor film 41 between the uppermost conductor layer 22 and the conductor layer 23 is in contact with an upper end of a portion of the resistance change film 42 and a portion of the semiconductor film 44 which are provided for the uppermost conductor layer 22. Thereby, the lower end of the portion of the conductor film 41 between the uppermost conductor layer 22 and the conductor layer 23 can be Schottky-bonded to an upper end of the portion of the semiconductor film 44 provided for the uppermost conductor layer 22. An upper end of a portion of the conductor film 41 between the uppermost conductor layer 22 and the conductor layer 23 is in contact with the lower end of the portion of the semiconductor film 44 provided for the conductor layer 23. Thereby, the upper end of the portion of the conductor film 41 between the uppermost conductor layer 22 and the conductor layer 23 can be Schottky-bonded to the lower end of the portion of the semiconductor film 44 provided for the conductor layer 23.

A lower end of a portion of the conductor film 41 above the conductor layer 23 is in contact with an upper end of the portion of the semiconductor film 44 provided for the conductor layer 23.

The insulator film 45 covers the semiconductor film 44 and the conductor film 41. The insulator film 45 is provided as a continuous film for each memory pillar MP. Namely, the insulator film 45 has a portion located between each of the conductor layers 22 and 23 and a corresponding semiconductor film 44. The insulator film 45 includes, for example, silicon oxide, silicon nitride, or metal oxide. The insulator film 45 functions as a gate insulating film for the switching elements SW of the memory cells MC0 to MC7 and the select transistor STD.

With the above configuration, the conductor layers 22 and 23, the conductor film 41, the semiconductor film 44, and the insulator film 45 can make the switching elements SW of the memory cells MC0 to MC7 and the select transistor STD function as a Schottky barrier transistor.

The contacts CV having a column shape are provided on an upper end of a portion of the conductor film 41 above the conductor layer 23. Each of the illustrated two contacts CV corresponds to one of the two memory pillars MP in a cross-sectional region separated by the members SLT and SHE. It is noted that, among the three memory pillars MP illustrated in the figure, one memory pillar MP to which the contact CV is not connected is connected to a corresponding contact CV in another region not illustrated in the drawing.

One conductor layer 24 (one bit line BL) is provided on an upper surface of the contact CV. The one conductor layer 24 is in contact with one contact CV in each of spaces separated by the members SLT and SHE. Namely, for each of the conductor layers 24, one memory pillar MP provided between the adjacent members SLT or SHE is electrically connected to the conductor layer 24.

The member SLT has, for example, a portion provided along the XZ plane. The member SLT divides the conductor layers 22 and 23. An upper end of the member SLT is located above the conductor layer 23. A part of an upper end of the contact LI in the member SLT is in contact with the insulator layer 33. A lower end of the contact LI is in contact with the conductor layer 21. The spacer SP is provided between the contact LI and the conductor layers 22 and 23. The contact LI and the conductor layers 22 and 23 are separated and insulated by the spacer SP. The contact LI may be used as a part of the source line SL.

The member SHE has a portion provided along the XZ plane. The member SHE divides the conductor layer 23. An upper end of the member SHE is in contact with the insulator layer 33. A lower end of the member SHE is in contact with the uppermost insulator layer 32.

Next, a cross-sectional structure of the memory pillar MP along the XY plane will be described with reference to FIGS. 5, 6, and 7.

Figure 5:
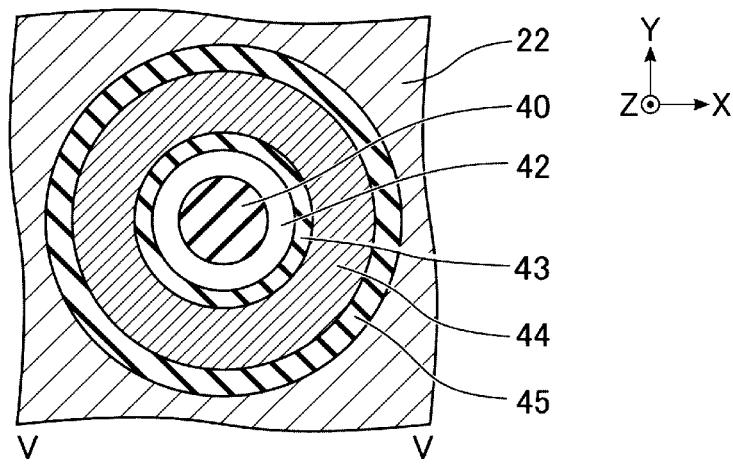
FIG. 5 is a cross-sectional view taken along line V-V of FIG. 4 and illustrating an example of a cross-sectional structure of a memory cell of a memory device according to an embodiment.
Figure 6:
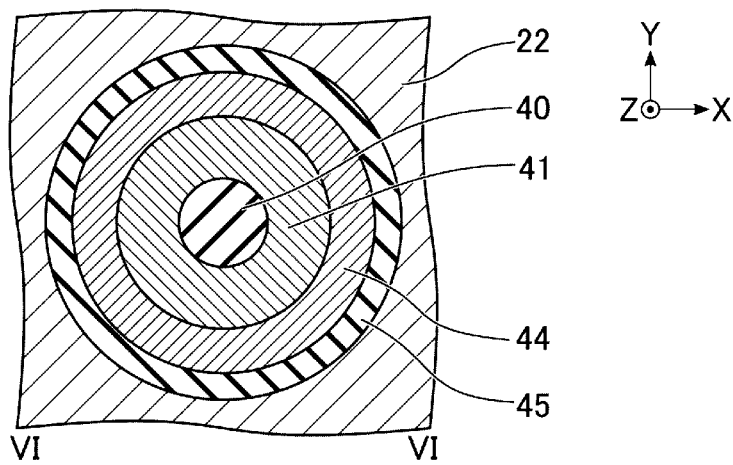
FIG. 6 is a cross-sectional view taken along line VI-VI of FIG. 4 and illustrating an example of a cross-sectional structure of a memory cell of a memory device according to an embodiment.

FIGS. 5 and 6 are respectively cross-sectional views taken along line V-V and line VI-VI line of FIG. 4 and illustrating examples of a cross-sectional structure of a memory cell of a memory device according to an embodiment. FIG. 7 is a cross-sectional view taken along line VII-VII of FIG. 4 and illustrating an example of a cross-sectional structure of a select transistor of the memory device according to the embodiment.

As illustrated in FIG. 5, the core film 40 of a circle shape is provided at the center of the memory pillar MP in the XY plane which includes the conductor layer 22 and the resistance change film 42. The resistance change film 42 concentrically surrounds a side surface of the core film 40. The insulator film 43 concentrically surrounds a side surface of the resistance change film 42. The semiconductor film 44 concentrically surrounds a side surface of the insulator film 43. The insulator film 45 concentrically surrounds side surfaces of the semiconductor film 44. Then, the conductor layer 22 surrounds a side surface of the insulator film 45.

As illustrated in FIG. 6, the core film 40 of a circle shape is provided at the center of the memory pillar MP in the XY plane which includes the conductor layer 22 and the conductor film 41. The conductor film 41 concentrically surrounds the side surfaces of the core film 40. The semiconductor film 44 concentrically surrounds a side surface of the conductor film 41. The insulator film 45 concentrically surrounds the side surfaces of the semiconductor film 44. Then, the conductor layer 22 surrounds a side surface of the insulator film 45.

With the above configuration, a portion of the memory pillar MP which intersects a conductor layer 22 at one layer can function as the resistance change element RC and the switching element SW connected in parallel to each other.

Figure 7:
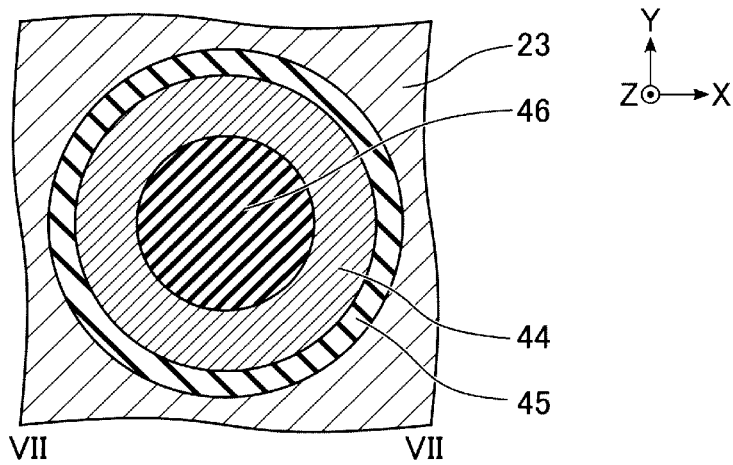
FIG. 7 is a cross-sectional view taken along line VII-VII of FIG. 4 and illustrating an example of a cross-sectional structure of a select transistor of a memory device according to an embodiment.

Furthermore, as illustrated in FIG. 7, the core film 46 of a circle shape is provided at the center of the memory pillar MP in the XY plane which includes the conductor layer 23. The semiconductor film 44 concentrically surrounds side surfaces of the core film 46. The insulator film 45 concentrically surrounds the side surfaces of the semiconductor film 44. Then, the conductor layer 23 surrounds the side surface of the insulator film 45.

With the above configuration, a portion of the memory pillar MP which intersects with the conductor layer 23 can function as the select transistor STD.

1.2 Operation

Next, an operation of a memory device according to an embodiment will be described. In the following description, components related to the memory cell MC to be operated may be marked with "selected", and components not related to the memory cell MC to be operated may be marked with "unselected" to distinguish the components from each other.

1.2.1 Write Operation

Figure 8:
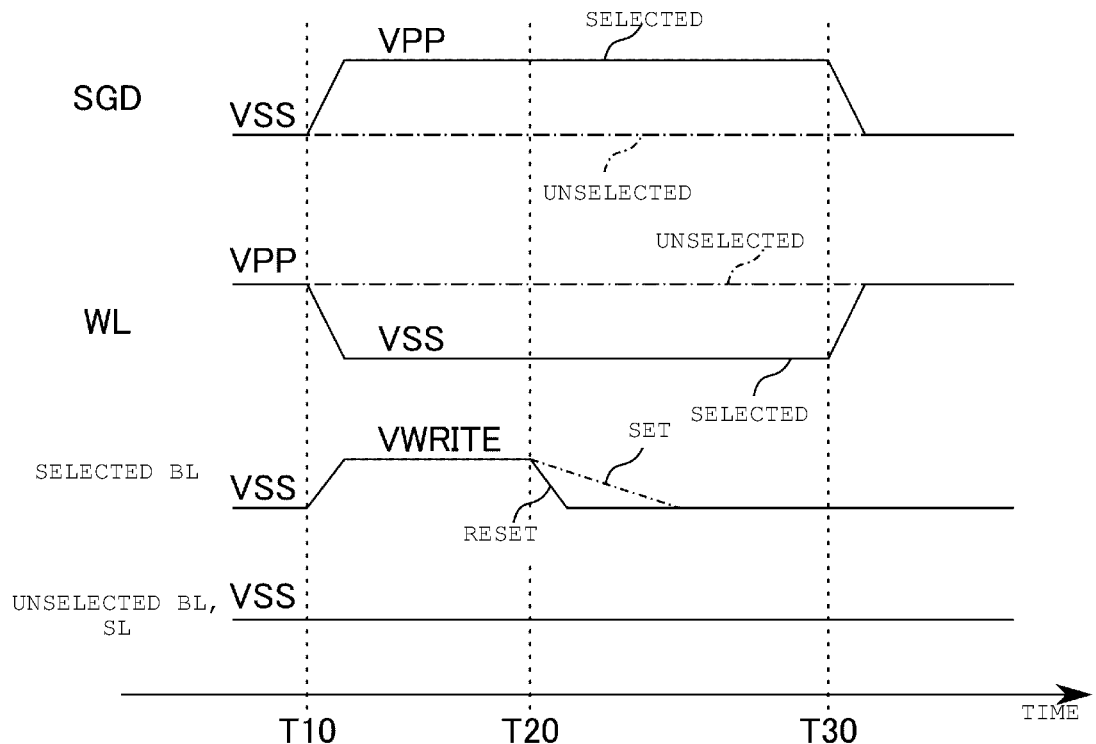
FIG. 8 is a timing chart of a write operation of a memory device according to an embodiment.

FIG. 8 is a timing chart illustrating an example of a write operation of a memory device according to an embodiment. FIG. 8 illustrates an example of changes in voltage applied to the select gate line SGD, the word line WL, the bit line BL, and the source line SL when data is being written to the memory cell MC.

As illustrated in FIG. 8, each of the select gate line SGD, the word line WL, the bit line BL, and the source line SL is in a standby state until time T10. Specifically, in the standby state, a voltage VSS is supplied to the select gate line SGD, the bit line BL, and the source line SL, and a voltage VPP is supplied to the word line WL. The voltage VSS is, for example, 0 V and may turn off the switching elements SW and the select transistors STD. The voltage VPP is higher than the voltage VSS and may turn on the switching elements SW and the select transistors STD. Therefore, until the time T10, all the select transistors STD are turned off, and all the switching elements SW are turned on.

At the time T10, the row decoder module 15 applies the voltage VPP and the voltage VSS respectively to the selected select gate line SGD and the unselected select gate line SGD. Thereby, the selected select transistor STD is turned on, and the unselected select transistor STD is turned off. Accordingly, the memory string MS connected to the selected bit line BL is enabled (selected).

Further, the row decoder module 15 also applies the voltage VSS and the voltage VPP respectively to the selected word line WL and the unselected word line WL. Thereby, the switching element SW of the selected memory cell MC and the switching element SW of the unselected memory cell MC in the selected memory string MS are respectively turned off and on.

The sense amplifier module 16 applies a voltage VWRITE to the selected bit line BL. Thereby, a current flows through the memory cell MC in the selected memory string MS. Specifically, among the selected memory strings MS, a current flows through the resistance change element RC in the selected memory cell MC, and a current flows through the switching element SW in all the other unselected memory cells MC. It is noted that the voltage VWRITE is lower than the voltage VPP but is sufficient to melt an alloy in the resistance change element RC if applied for a sufficient period. Accordingly, a temperature of the resistance change element RC of the selected memory cell MC increases because a current flows according to the voltage VWRITE, and the alloy in the resistance change element RC melts.

At time T20, the sense amplifier module 16 changes a voltage of the selected bit line BL from the voltage VWRITE to the voltage VSS. Here, when the resistance change element RC phase-changes is to be placed in a high resistance state (enter a reset state), the sense amplifier module 16 rapidly decreases the voltage of the selected bit line BL. Thereby, the resistance change element RC of the selected memory cell MC remains in an amorphous state and thus phase-changes to a high resistance state. However, when the resistance change element RC is to be placed in a low resistance state (enter a set state), the sense amplifier module 16 more slowly decreases the voltage of the selected bit line BL than for the reset state. Thereby, the resistance change element RC of the selected memory cell MC enters a crystal state and thus phase-changes to a low resistance state.

At time T30, the row decoder module 15 and the sense amplifier module 16 return each of the select gate line SGD, the word line WL, the bit line BL, and the source line SL to a standby state.

Thereby, the write operation of data to the selected memory cell MC is completed.

1.2.2 Read Operation

Figure 9:
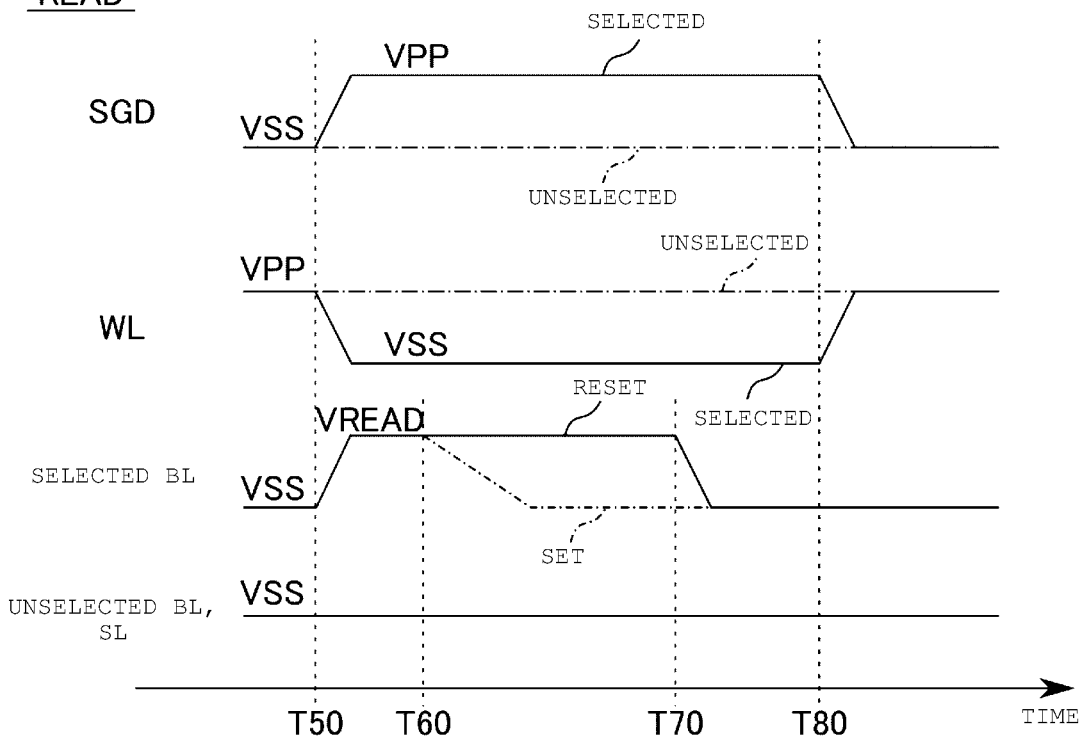
FIG. 9 is a timing chart of a read operation of a memory device according to an embodiment.

FIG. 9 is a timing chart illustrating an example of a read operation of a memory device according to an embodiment. FIG. 9 illustrates an example of voltage changes applied to the select gate line SGD, the word line WL, the bit line BL, and the source line SL when data is being read out from the memory cell MC.

As illustrated in FIG. 9, each of the select gate line SGD, the word line WL, the bit line BL, and the source line SL is in a standby state until time T50.

At the time T50, the row decoder module 15 applies the voltage VPP and the voltage VSS, respectively, to the selected select gate line SGD and the unselected select gate line SGD. Thereby, the selected select transistor STD is turned on, and the unselected select transistor STD is turned off. Accordingly, the memory string MS connected to the selected bit line BL is selected.

Further, the row decoder module 15 also applies the voltage VSS and the voltage VPP respectively to the selected word line WL and the unselected word line WL. Thereby, the switching element SW of the selected memory cell MC and the switching element SW of the unselected memory cell MC in the selected memory string MS are respectively turned off and on.

The sense amplifier module 16 applies a voltage VREAD to the selected bit line BL. Thereby, a current flows through the memory cell MC in the selected memory string MS. Specifically, among the selected memory strings MS, a current flows through the resistance change element RC in the selected memory cell MC, and a current flows through the switching element SW in all the other unselected memory cells MC. It is noted that the voltage VREAD is a voltage which is lower than the voltage VPP but provides a current flow through the resistance change element RC having a sufficient magnitude to be within a range in which an alloy in the resistance change element RC will not be melted.

At time T60, the sense amplifier module 16 stops driving of the selected bit line BL. When the resistance change element RC of the selected memory cell MC is in a high resistance state (a reset state), a current flowing through the selected memory cell MC is relatively small. Accordingly, a voltage of the selected bit line BL hardly changes from the voltage VREAD even after a predetermined time has elapsed from the time T60. However, when the resistance change element RC of the selected memory cell MC is in a low resistance state (set state), a current flowing through the selected memory cell MC is relatively large. Accordingly, the voltage of the selected bit line BL decreases significantly from the voltage VREAD after a predetermined time has elapsed from the time T60.

The sense amplifier module 16 senses a difference in the voltage change of the selected bit line BL due to a difference in a resistance state of the resistance change element RC of the selected memory cell MC. Thereby, data stored in the selected memory cell MC can be read out.

At time T70, when checking that the data has been read out from the selected memory cell MC, the sense amplifier module 16 supplies the voltage VSS to the selected bit line BL.

At time T80, the row decoder module 15 and the sense amplifier module 16 return each of the select gate line SGD, the word line WL, the bit line BL, and the source line SL to a standby state.

Thereby, the read operation of data from the selected memory cell MC is completed.

1.3 Method of Manufacturing Memory Cell Array

Each of FIGS. 10 to 25 is a cross-sectional view illustrating a cross-sectional structure during stages of the manufacturing of a memory device according to an embodiment. The illustrated cross-sectional structure illustrates a region corresponding in general to FIG. 4. Hereinafter, an example of a manufacturing process of the memory cell array 10 in the memory device 3 will be described.

Figure 10:
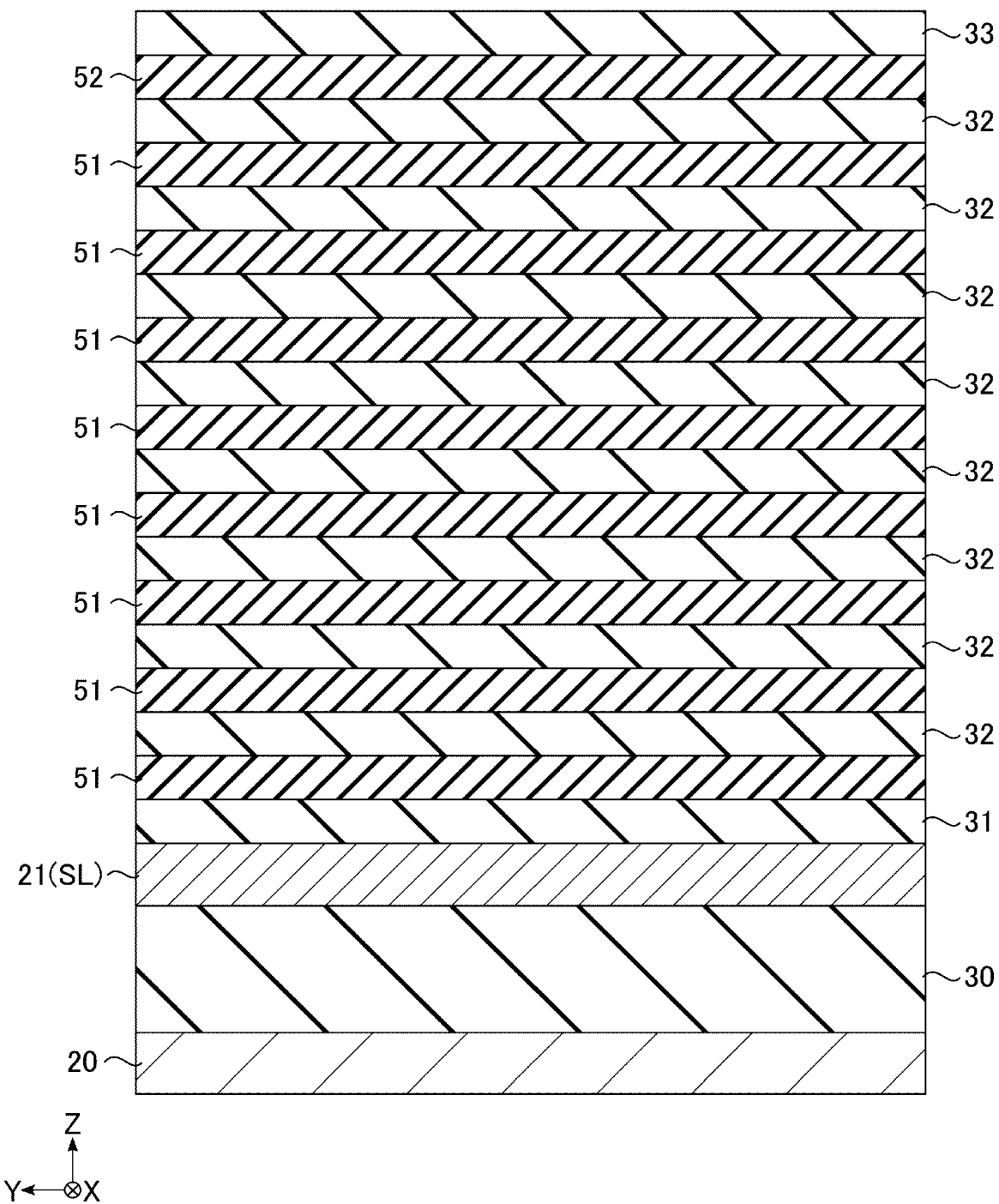
FIGS. 10-25 are cross-sectional views illustrating aspects related to manufacturing of a memory device according to an embodiment.

First, as illustrated in FIG. 10, the insulator layer 30 is formed on an upper surface of the semiconductor substrate 20. The conductor layer 21 and the insulator layer 31 are sequentially stacked on an upper surface of the insulator layer 30. A sacrificial layer 51 and the insulator layer 32 are alternately stacked on an upper surface of the insulator layer 31. A sacrificial layer 52 and the insulator layer 33 are sequentially stacked on an upper surface of the uppermost insulator layer 32. Thereby, a stack structure including the sacrificial layers 51 and 52 is formed. An upper surface of the stack structure is planarized by, for example, chemical mechanical polishing (CMP). The sacrificial layers 51 and 52 include, for example, silicon nitride.

Figure 11:
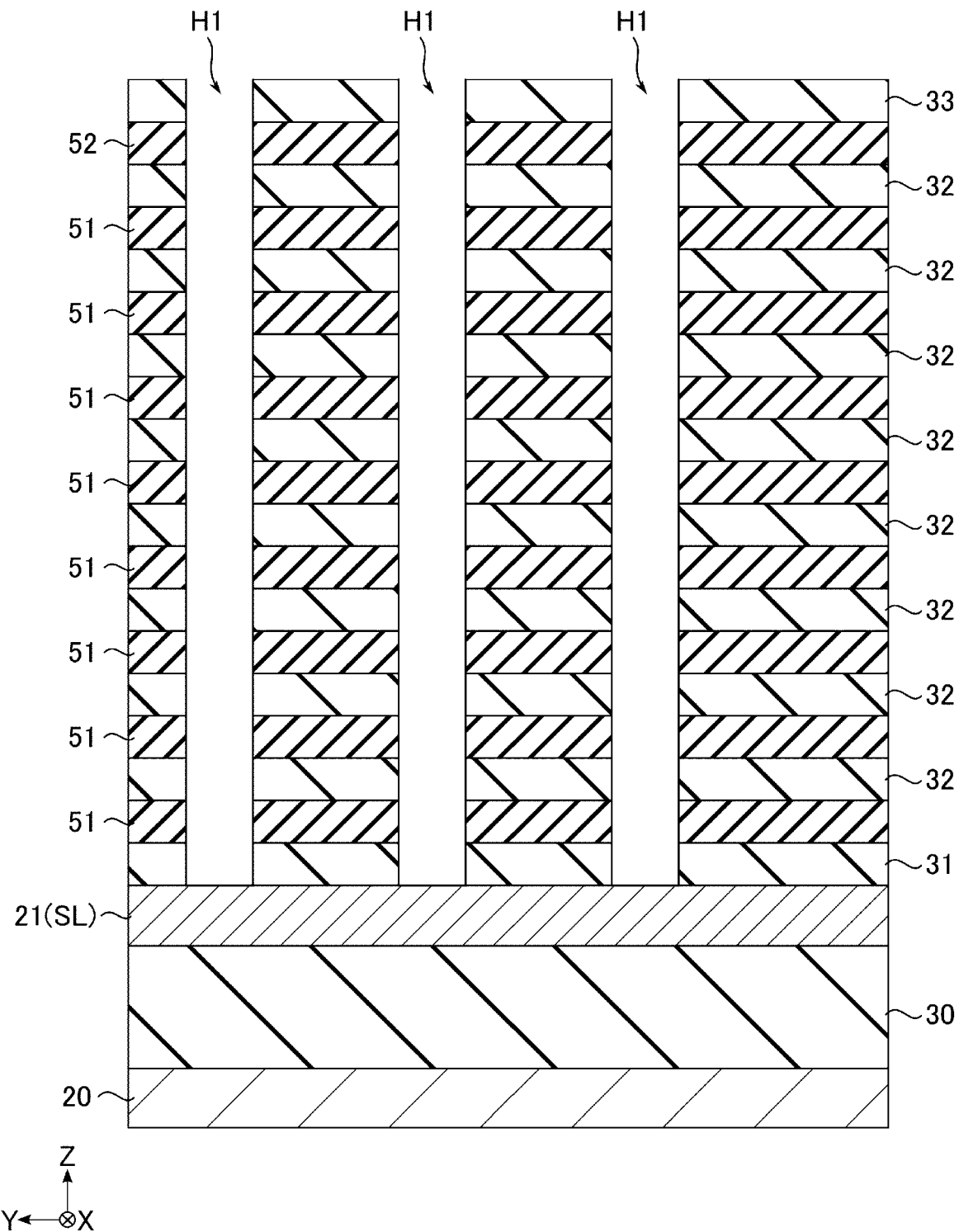

Next, as illustrated in FIG. 11, a mask having an open region corresponding to the memory pillars MP is formed by photolithography or the like. Then, a plurality of holes H1 penetrating the insulator layers 31 to 33 and the sacrificial layers 51 and 52 are formed by anisotropic etching using the mask. A part of the conductor layer 21 is exposed at a bottom of each of the holes H1.

Figure 12:
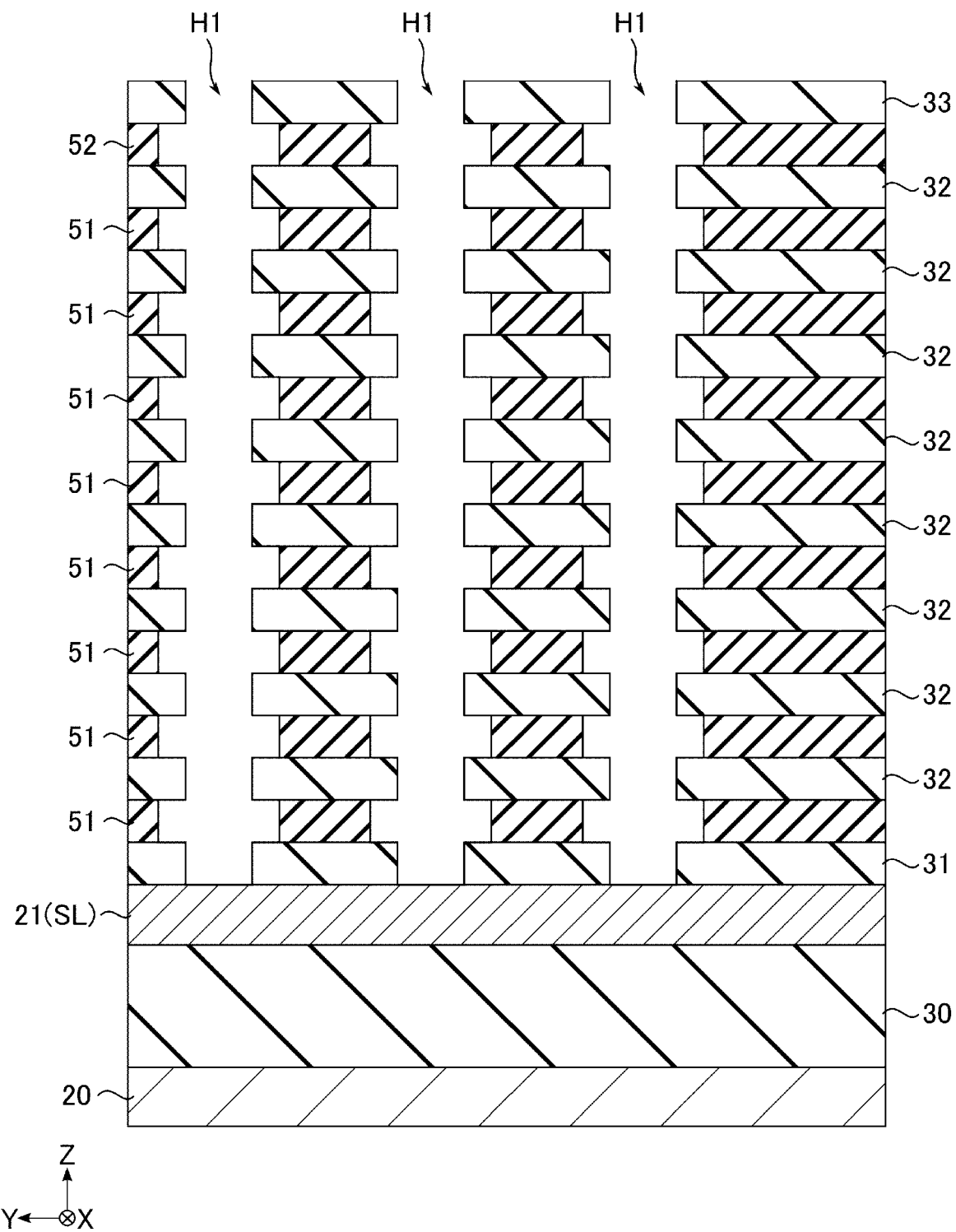

Next, as illustrated in FIG. 12, the sacrificial layers 51 and 52 exposed on the side surface of each of the holes H1 are recessed by, for example, wet etching. Thereby, in each of the holes H1, recesses are formed at heights corresponding to the positions (levels) of the sacrificial layers 51 and 52.

Figure 13:
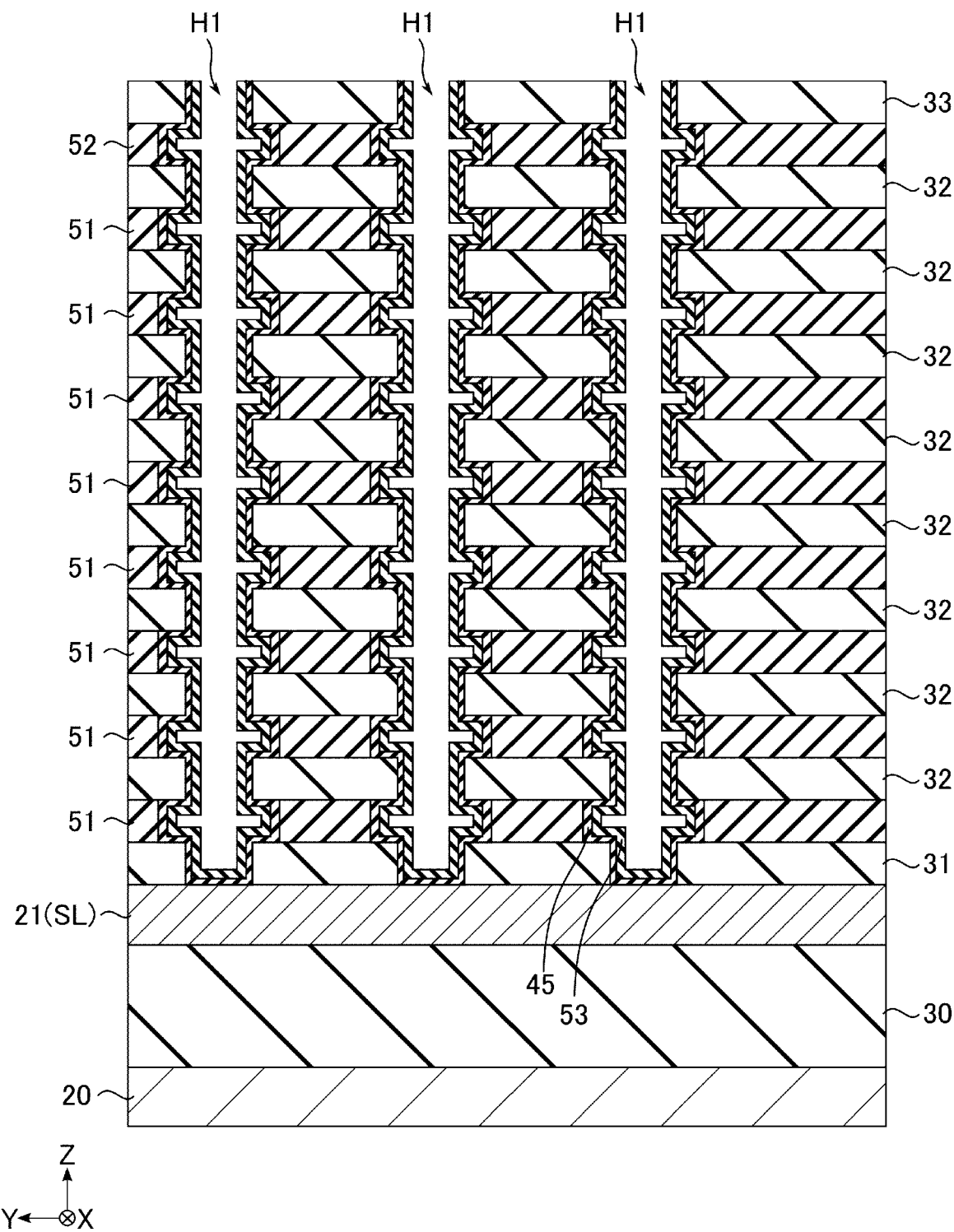

Next, as illustrated in FIG. 13, the insulator film 45 and a protective film 53 are formed in each of the holes H1. The protective film 53 includes, for example, silicon nitride. For example, atomic layer deposition (ALD) or chemical vapor deposition (CVD) is used to form the insulator film 45 and the protective film 53 in the present process.

Figure 14:
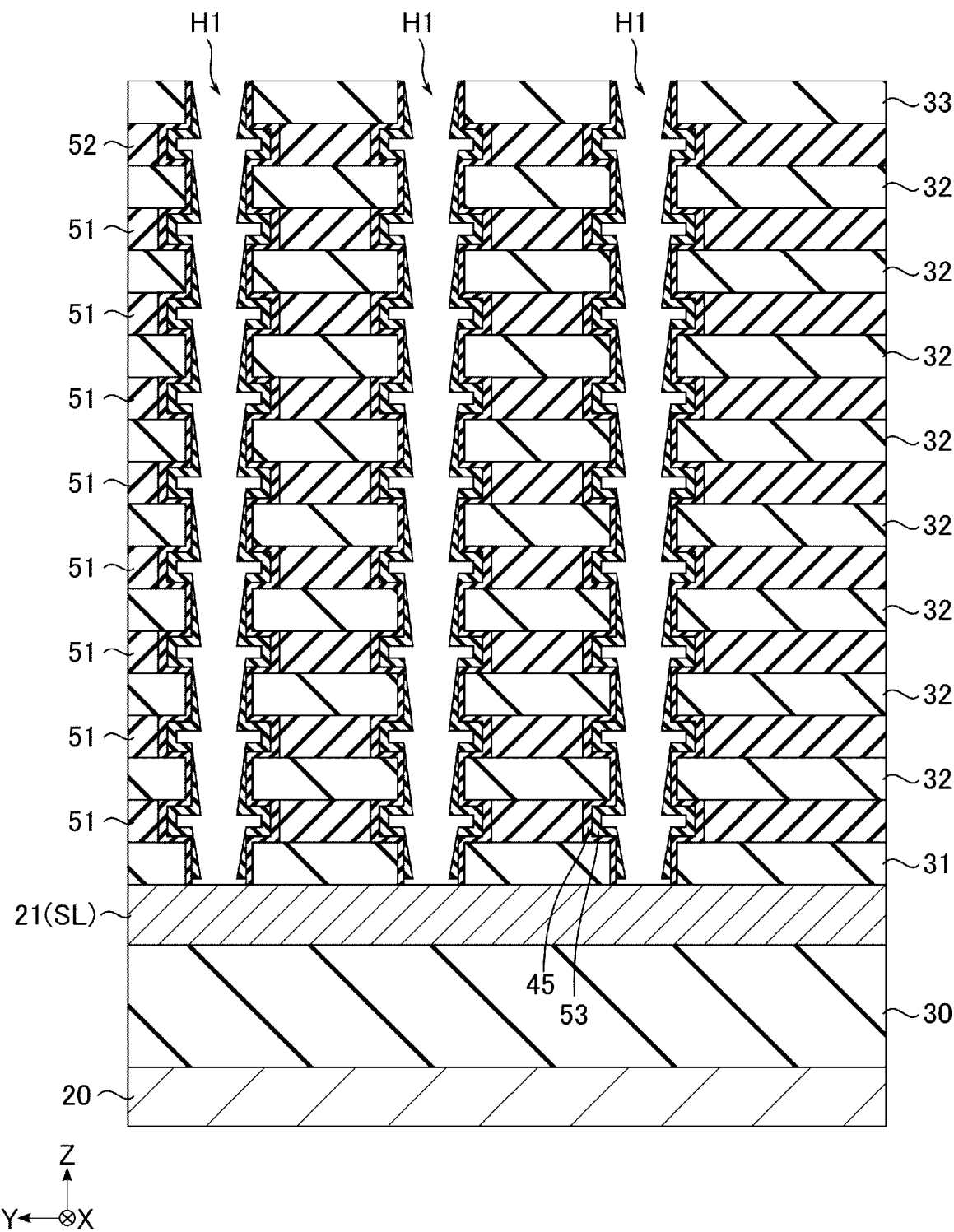

Next, as illustrated in FIG. 14, the protective film 53 on a bottom surface of each of the holes H1 is removed by anisotropic etching. Thereby, a part of the insulator film 45 is exposed on the bottom surface of each of the holes H1. For example, reactive ion etching (RIE) is used for the anisotropic etching of the protective film 53 in this process. Thereafter, a part of the insulator film 45 exposed on the bottom surface of each of the holes H1 can be selectively removed by, for example, wet etching. Thereby, a part of the conductor layer 21 is exposed at the bottom surface of each of the holes H1. After the insulator film 45 on the bottom surface of each of the holes H1 is removed, the remaining protective film 53 is removed (see FIG. 15).

Figure 15:
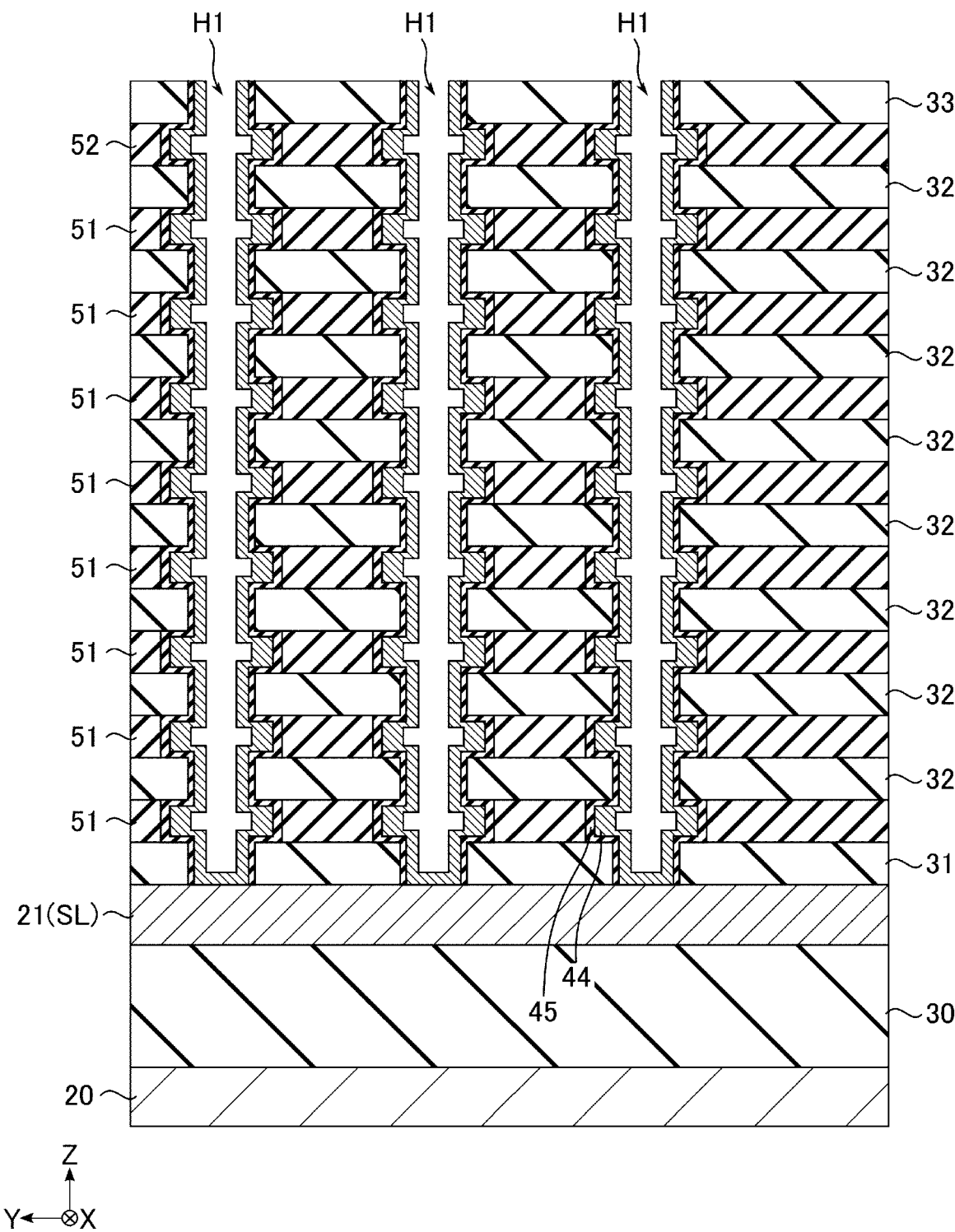

Next, as illustrated in FIG. 15, the semiconductor film 44 is formed as a continuous film in each of the holes H1. The semiconductor film 44 may include impurities such as phosphorus (P) and boron (B) of $1\times10^{19}$ cm$^{-3}$ or less, but undoped silicon (Si) is more preferable. When the semiconductor film 44 is formed, recesses located at the heights at which the sacrificial layers 51 and 52 are formed are not completely filled. Accordingly, after the semiconductor film 44 is formed, recesses are left in each of the holes H1 at heights corresponding to the sacrificial layers 51 and 52.

Figure 16:
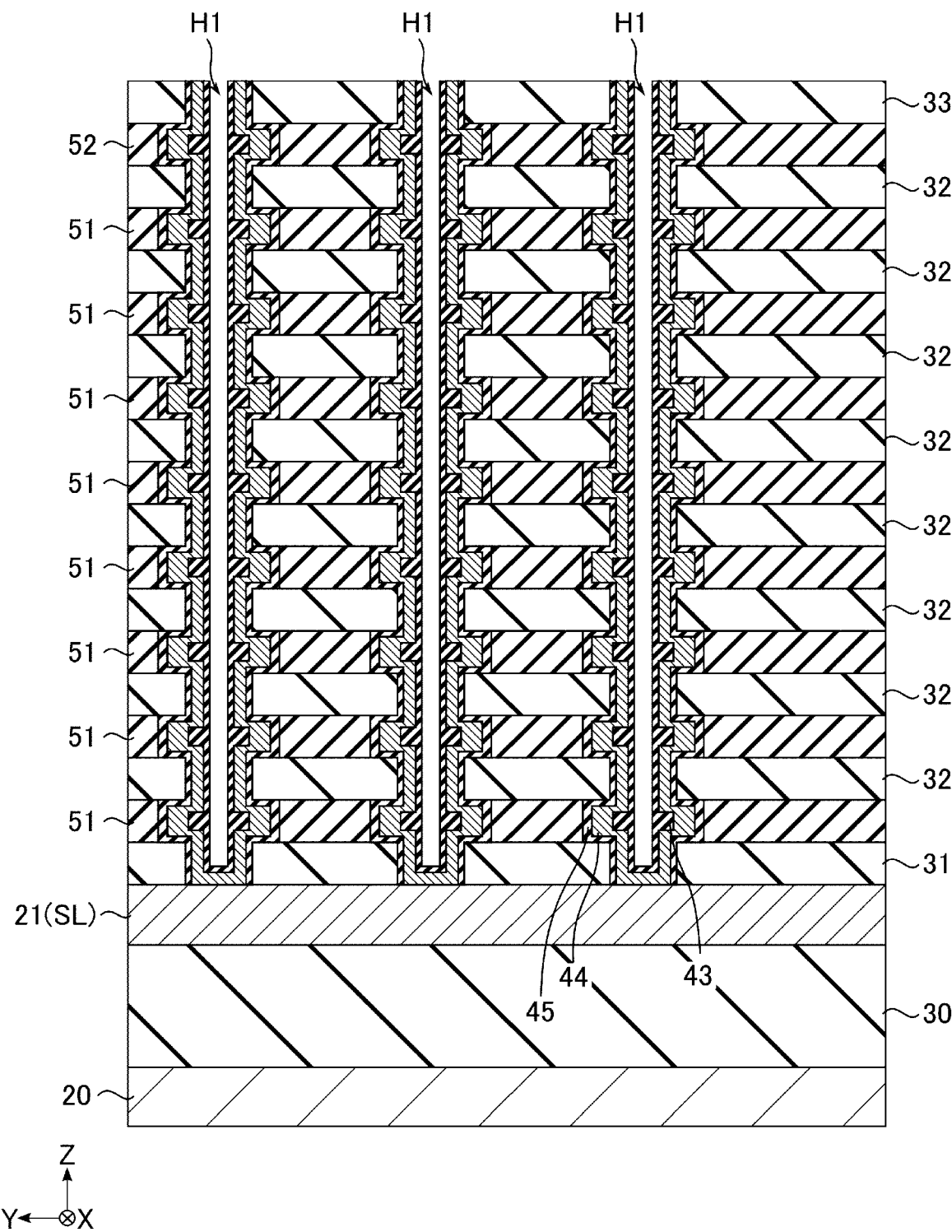

Next, as illustrated in FIG. 16, the insulator film 43 is formed as a continuous film in each of the holes H1. When the insulator film 43 is formed, the recesses in each of the holes H1 are embedded with the insulator film 43. For example, atomic layer deposition (ALD) is used to form the insulator film 43 in this process.

Figure 17:
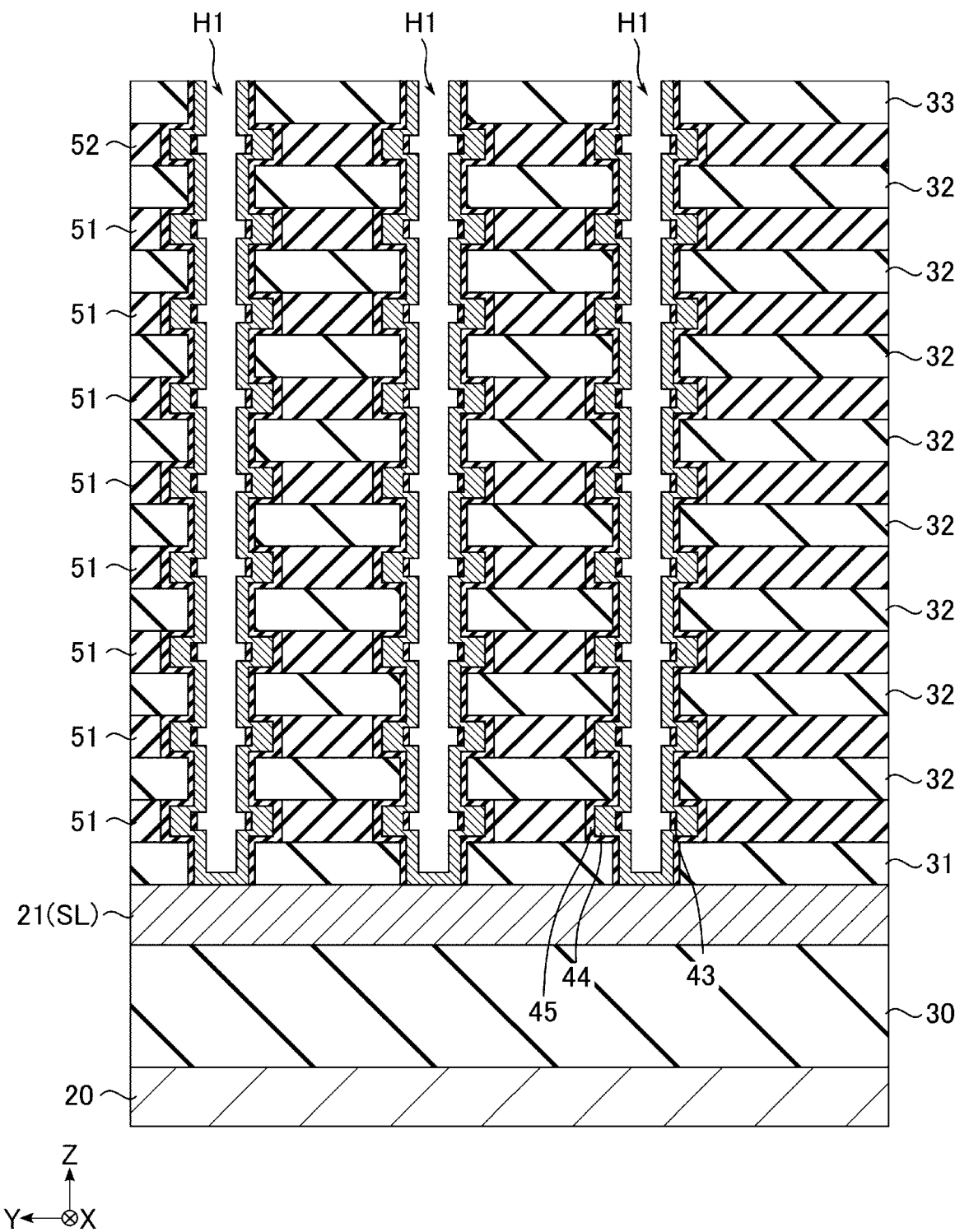

Next, as illustrated in FIG. 17, a part of the insulator film 43 in each of the holes H1 is removed. Thereby, the insulator film 43 is removed but leaving portions in the recesses still in each of the holes H1. By removing a part of the insulator film 43, recesses are formed again at heights matching the sacrificial layers 51 and 52 in each of the holes H1.

Figure 18:
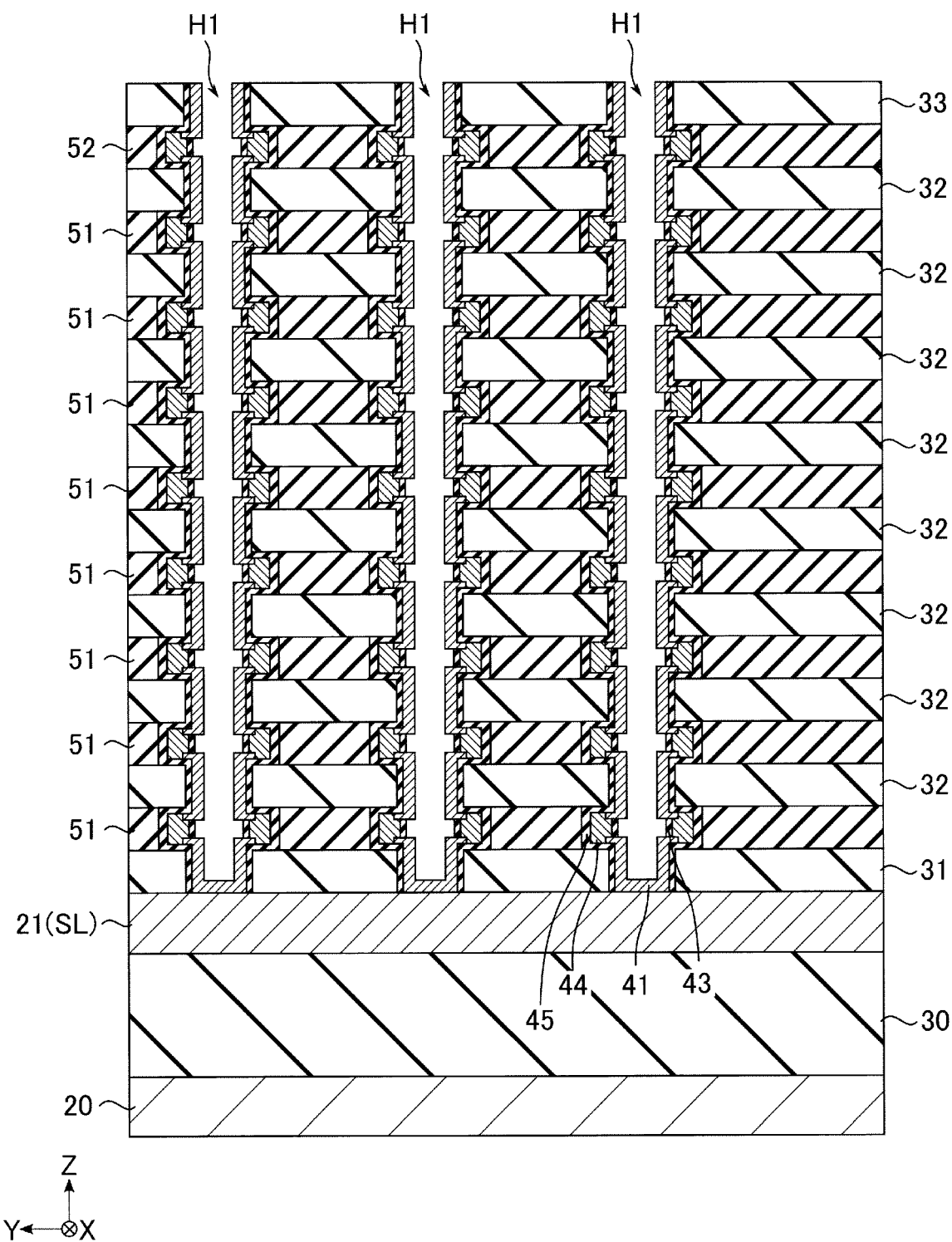

Next, as illustrated in FIG. 18, the conductor film 41 is formed by silicidizing a part of the semiconductor film 44 in each of the holes H1. Specifically, for example, nickel is supplied into the holes H1 by CVD to silicidize the semiconductor film 44 from the exposed surface. Thereby, the conductor film 41 divides the semiconductor film 44 into a portion between the sacrificial layer 51 and the insulator film 43, and a portion between the sacrificial layer 52 and the insulator film 43. It is noted that the conductor film 41 preferably grows on the sacrificial layer 51 side and the sacrificial layer 52 side instead of the insulator film 43, in layers on which the sacrificial layers 51 and 52 are formed. Thereby, characteristics of the switching element SW as a Schottky barrier transistor can be improved.

Figure 19:
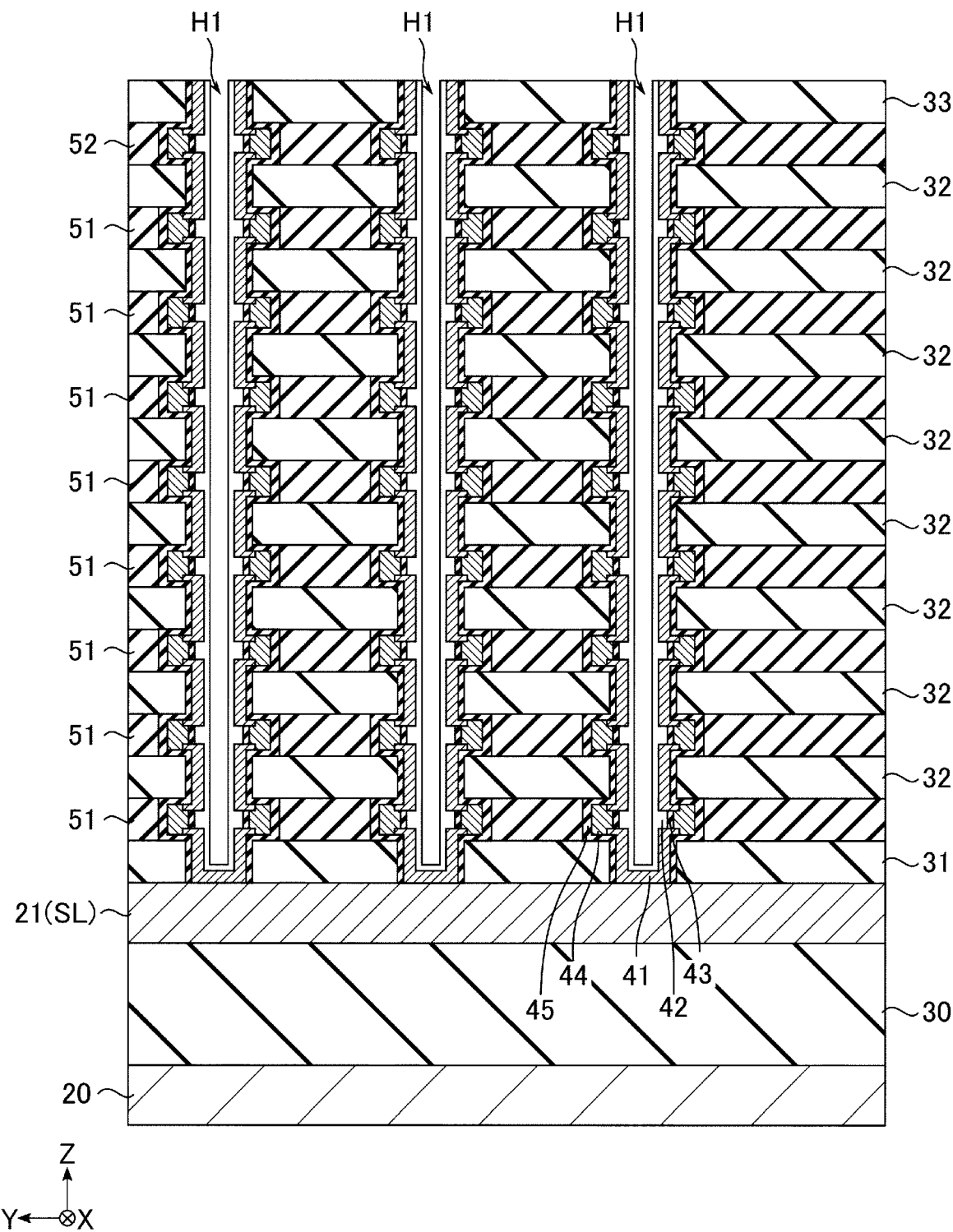

Next, as illustrated in FIG. 19, the resistance change film 42 is formed as a continuous film within each of the holes H1. During formation of the resistance change film 42, the recesses in each of the holes H1 are embedded (filled) by the resistance change film 42.

Figure 20:
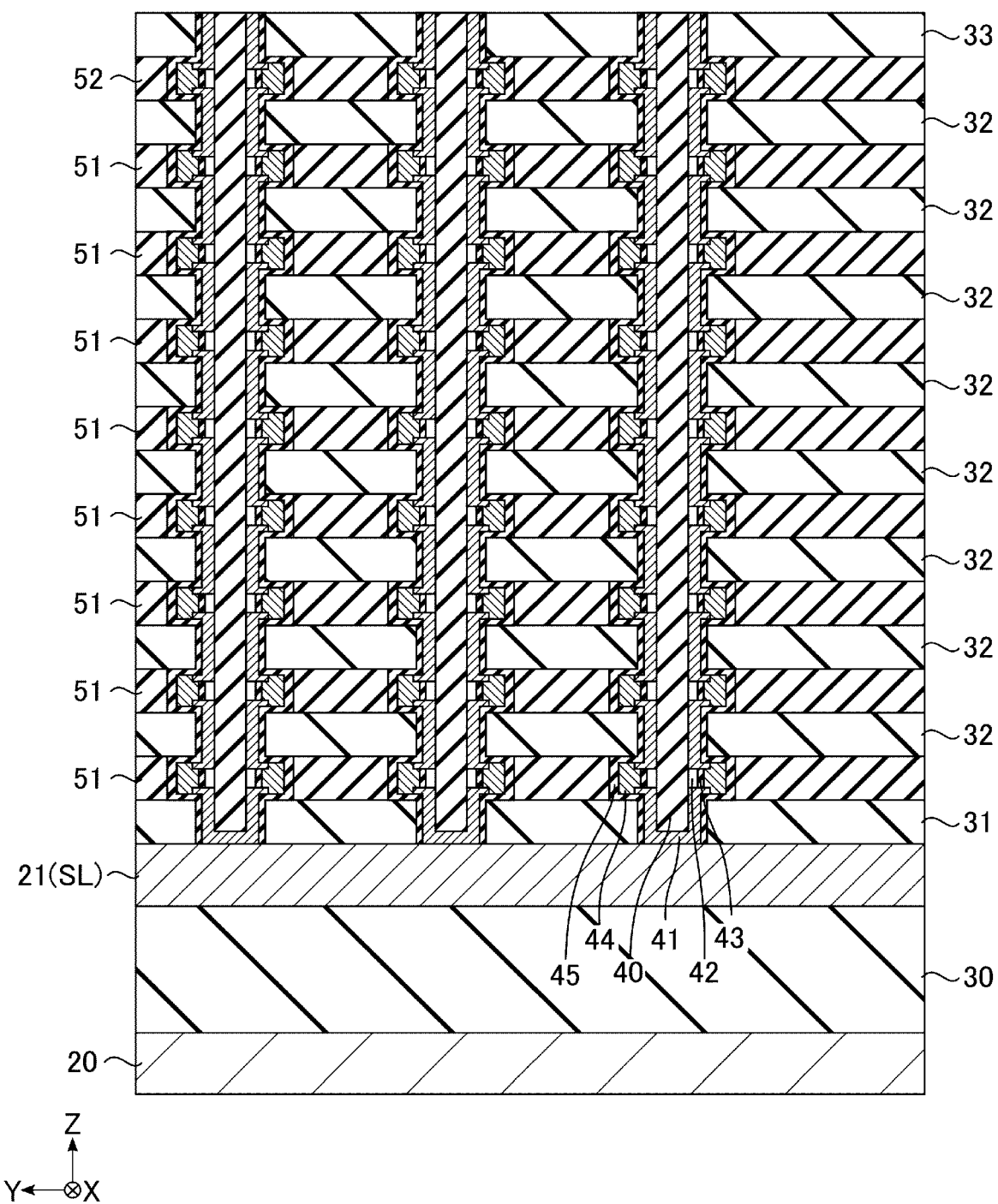

Next, as illustrated in FIG. 20, a part of the resistance change film 42 in each of the holes H1 is removed. Thereby, in each of the holes H1, the resistance change film 42 is removed but leaving behind those portions formed in the recesses. The recesses in each of the holes H1 are kept filled by the resistance change film 42. As such, by dividing the resistance change film 42 into different layers corresponding to those which the sacrificial layers 51 and 52 are formed, heat retention characteristics of the resistance change film 42 are improved. Accordingly, a memory cell can be driven with a smaller write current, namely, a lower power. Thereafter, the core film 40 is filled (embedded) into in each of the holes H1.

Figure 21:
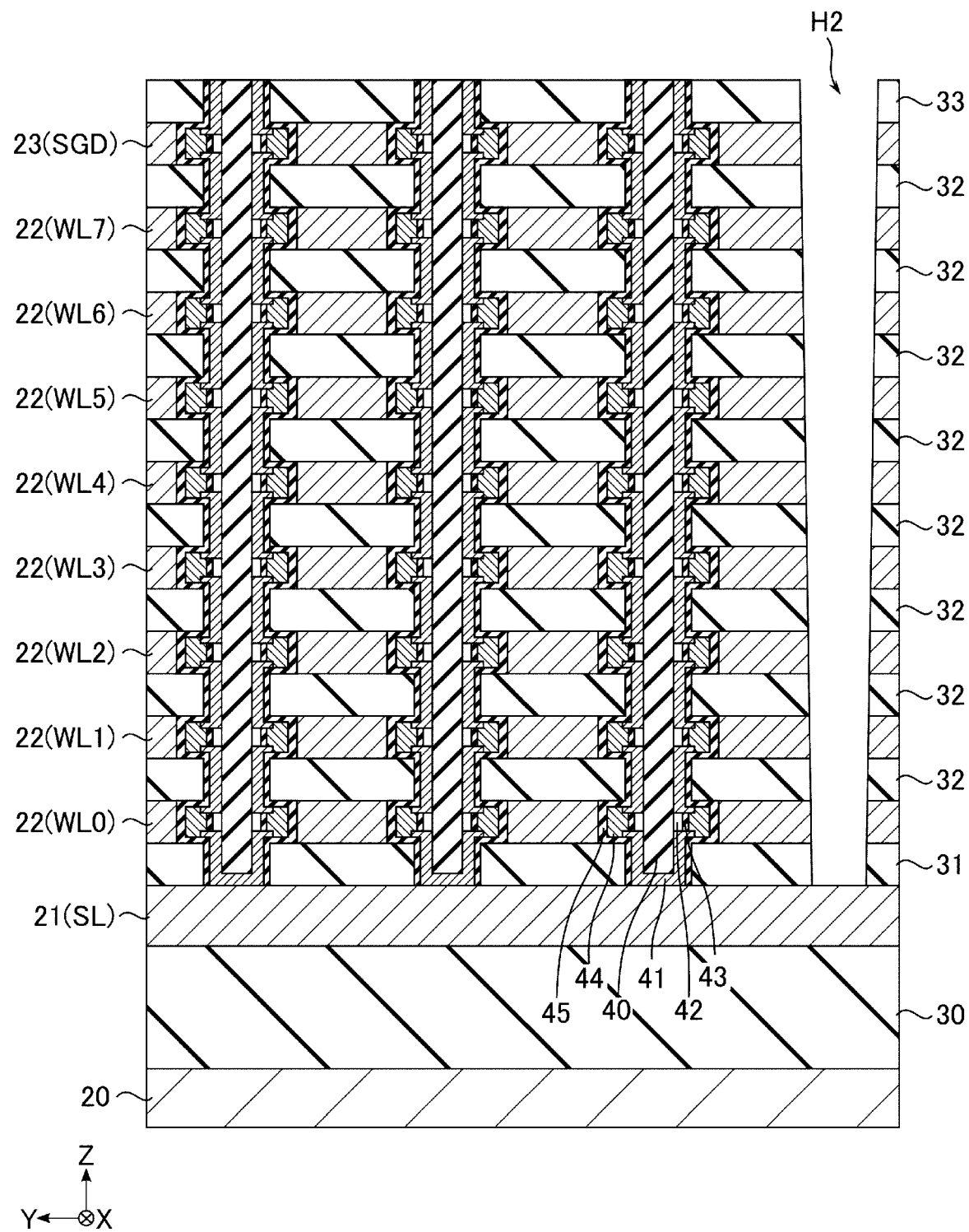

Next, as illustrated in FIG. 21, a mask having an open region corresponding to the member SLT is formed by photolithography or the like. Then, for example, a slit H2 penetrating the insulator layers 31 to 33 and the sacrificial layers 51 and 52 is formed by anisotropic etching using the mask. Thereby, a stack structure is divided in units of blocks BLK. For example, RIE is used for the anisotropic etching in the present process.

Subsequently, the sacrificial layers 51 and 52 are selectively removed via the slit H2 by wet etching using hot phosphoric acid or the like. The stack structure from which the sacrificial layers 51 and 52 are removed can be maintained by the structure filled into (formed inside) holes H1. Then, a conductor is embedded in the spaces from which the sacrificial layers 51 and 52 have been removed. The conductor is filled in via the slit H2. For example, CVD is used to form the conductor in the present process.

Thereafter, the conductor that has been formed in the slit H2 is removed during an etch back process, and the conductor formed in the adjacent wiring layers is thus separated. Thereby, a plurality of conductor layers 22 respectively functioning as the word lines WL0 to WL7 and the conductor layer 23 functioning as the select gate line SGD are formed. It is noted that the conductor layers 22 and 23 formed in the present process may include a barrier metal. In this case, during formation of the conductor after the sacrificial layers 51 and 52 are removed, a film of titanium nitride or the like is formed as a barrier metal, and then tungsten or the like is formed on the barrier metal. Thereby, the stack wiring structure LS is formed.

Figure 22:
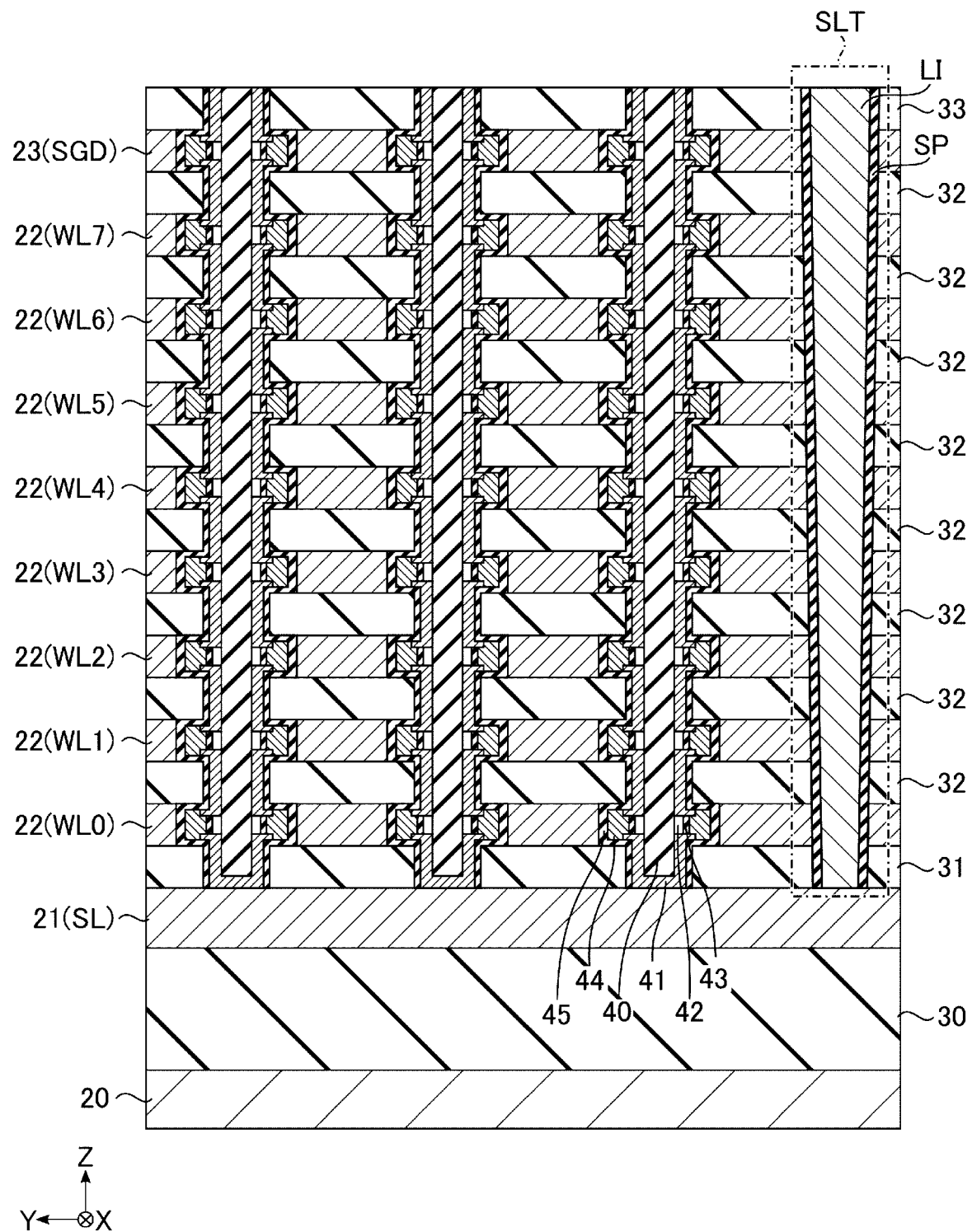

Next, as illustrated in FIG. 22, an insulating portion (the spacer SP) is formed to cover a side surface and a bottom surface of the slit H2. Then, a part of the spacer SP provided at the bottom of the slit H2 is removed, and a part of the conductor layer 21 is exposed at the bottom of the slit H2. Then, a conductor (the contact LI) is formed in the slit H2, and the conductor formed outside the slit H2 is removed by, for example, CMP.

Figure 23:
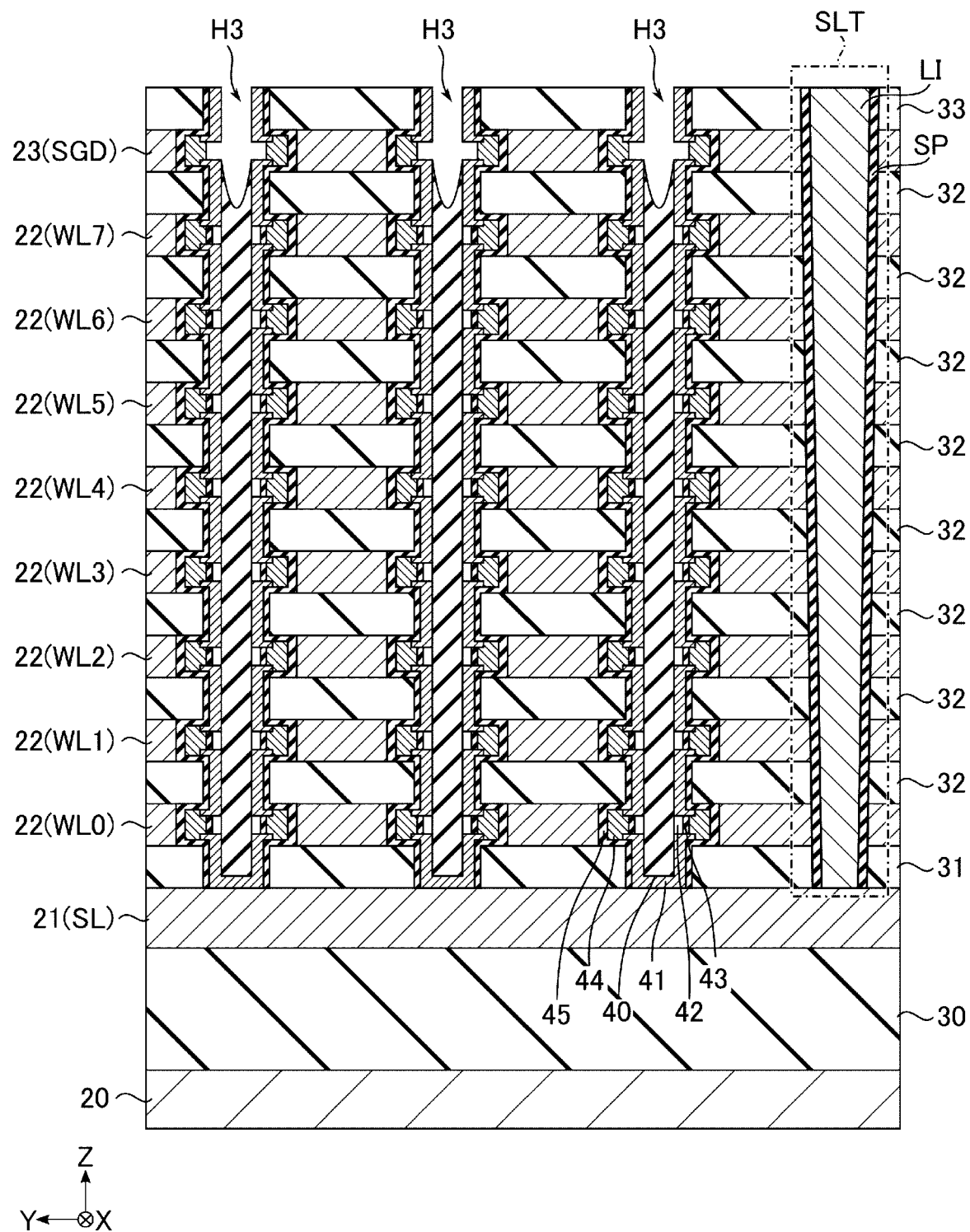

Next, as illustrated in FIG. 23, a hole H3 is formed by removing a part of the core film 40 during an etch back process. A bottom of the hole H3 is located between the conductor layer 23 and the uppermost conductor layer 22. Further, the semiconductor film 44 is exposed on a side surface of the hole H3 where the conductor layer 23 is formed.

Figure 24:
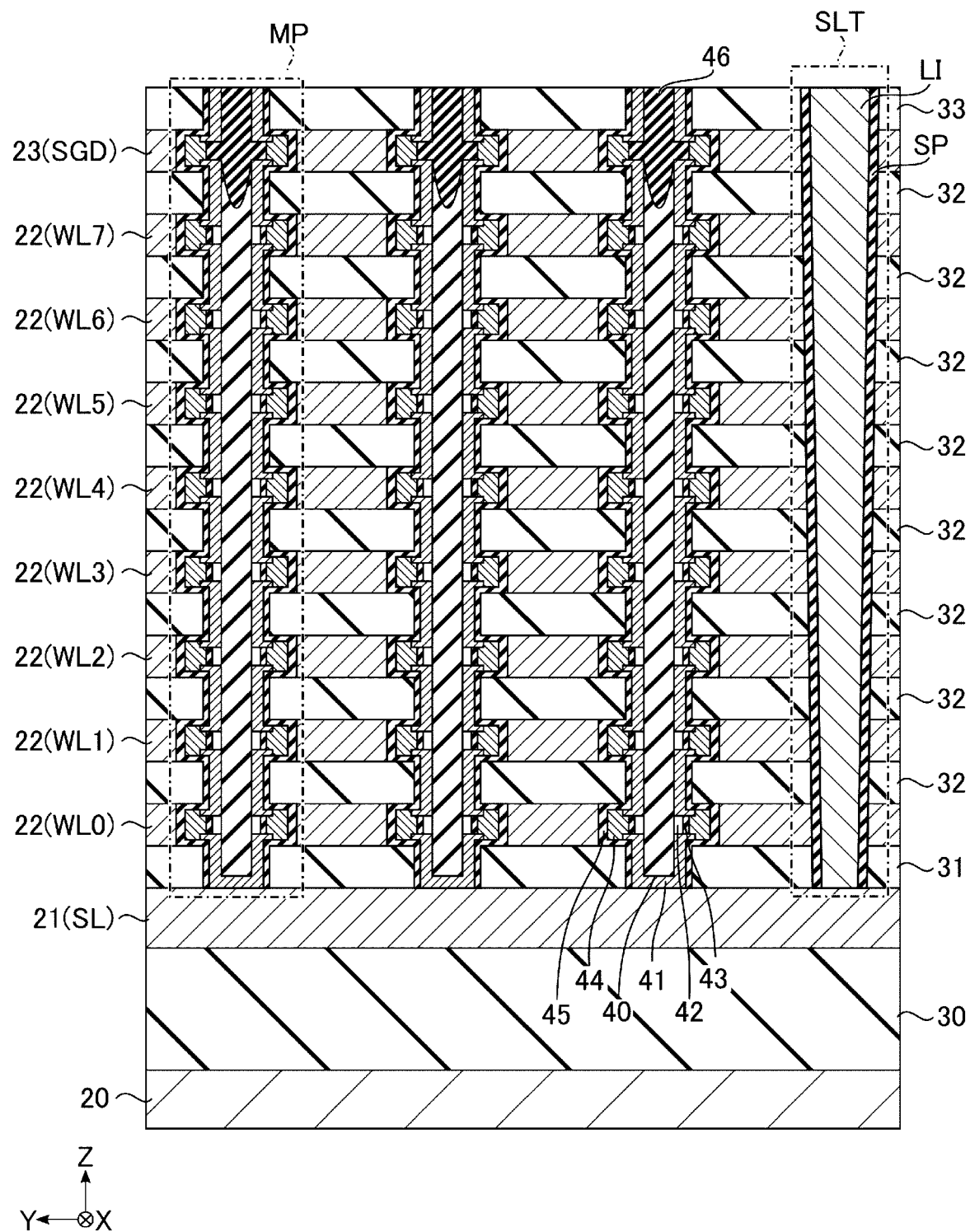

Next, as illustrated in FIG. 24, the core film 46 is buried (embedded) in the hole H3. Thereby, the memory pillar MP is formed.

Figure 25:
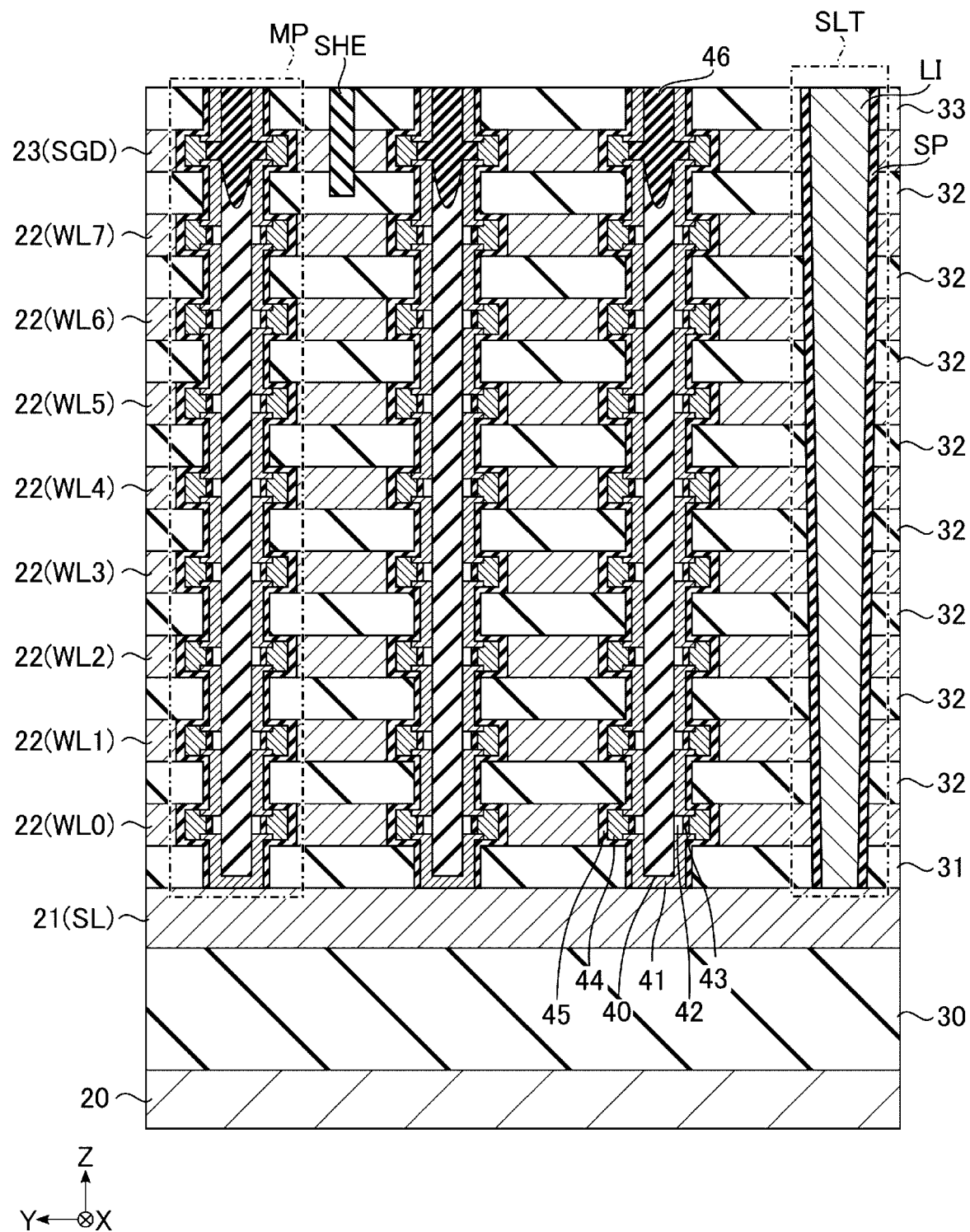

Next, as illustrated in FIG. 25, the member SHE that divides the conductor layer 23 in the stack wiring structure LS into a plurality of portions is formed.

The stack wiring structure LS of the memory cell array 10 is formed by the manufacturing process described above. It is noted that the manufacturing process described above is merely an example and is not limited thereto. For example, other processes may be inserted between described manufacturing processes, or some processes may be omitted or integrated with others. Furthermore, the described manufacturing processes may be interchanged or replaced to the extent possible.

1.4 Effect of Embodiment

According to an embodiment, the memory cells MC0 to MC7 are connected in series in the Z direction as a memory pillar MP structure. Thereby, the memory cells MC can be stacked three-dimensionally. Accordingly, integration density of the memory cell array 10 can be increased.

The semiconductor film 44 is disposed apart from the corresponding conductor layer 22 in the XY plane. The resistance change film 42 is provided on a side opposite to the conductor layer 22 with respect to the semiconductor film 44. The conductor film 41 has an upper end in contact with the semiconductor film 44 and the resistance change film 42 of the upper memory cell MC, and a lower end in contact with the semiconductor film 44 and the resistance change film 42 of the lower memory cell MC. Thereby, the switching element SW and the resistance change element RC of a certain memory cell MC can be connected in parallel to another memory cell MC. Accordingly, when the switching element SW is in an ON state, a corresponding resistance change element RC can be in an unselected state. Furthermore, when the switching element SW is in an OFF state, the corresponding resistance change element RC can be in a selected state.

The plurality of resistance change elements RC corresponding to the plurality of memory cells MC arranged in the Z direction are separated from each other. Thereby, the plurality of resistance change elements RC in the same memory string MS are physically separated from each other. Accordingly, influence of interference from adjacent memory cells MC can be reduced in a write operation and a read operation. Therefore, characteristics of the memory cell can be improved.

The conductor film 41 is formed by silicidizing a part of the semiconductor film 44. Thereby, the conductor film 41 becomes a metal film including nickel silicide or nickel disilicide. Accordingly, a bonding portion between the conductor film 41 and the semiconductor film 44 can be a Schottky-bonded. Therefore, the switching element SW can function as a Schottky barrier transistor.

Both the semiconductor film 44 and the resistance change film 42 are concentrically provided in the hole H1. Then, the semiconductor film 44 is formed on an outer periphery of the resistance change film 42 with respect to a central axis of the hole H1. Thereby, a channel width of the switching element SW can be longer than a width of the resistance change element RC. Accordingly, a resistance value when the switching element SW is turned on can be reduced as compared to when the channel width of the switching element SW is the same as the width of the resistance change element RC. Therefore, a current flowing through the selected memory cell MC can be increased compared to when the channel width of the switching element SW is the same as the width of the resistance change element RC.

2. Modification Example and the Like

An embodiment describes a case where the source line SL is formed in a flat plate shape, but the disclosure is not limited thereto. For example, the source line SL may be formed in a shape of a plurality of lines intersecting the bit line BL. Specifically, when a plurality of bit lines BL are arranged in the X direction, the plurality of source lines SL are arranged in, for example, the Y direction. Then, each of the plurality of source lines SL extends in the X direction.

An embodiment describes a PCRAM for storing data by using a resistance change element of which resistance value changes depending on a phase change of an element but the disclosure is not limited thereto. For example, an embodiment can also use a resistance change type memory having a resistance change element based on a principle different from PCRAM such as interfacial phase change random access memory (iPCRAM) or resistive random access memory (ReRAM).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device, comprising:
   a first conductor layer and a second conductor layer spaced apart from each other in a first direction intersecting a substrate plane;
   a first semiconductor film separated from the first conductor layer in a second direction intersecting the first direction;
   a second semiconductor film separated from the second conductor layer in the second direction;
   a first resistance change film separated from the first conductor in the second direction, the first semiconductor film being between the first resistance change film and the first conductor layer in the second direction;
   a second resistance change film separated from the second conductor in the second direction, the second semiconductor film being between the second resistance change film and the second conductor layer in the second direction; and
   a first conductor film having a first end in contact with the first semiconductor film and the first resistance change film and a second end in contact with the second semiconductor film and the second resistance change film.

2. The memory device according to claim 1, wherein the first conductor film is nickel silicide or nickel disilicide.

3. The memory device according to claim 2, wherein the first semiconductor film and the second semiconductor film comprise silicon.

4. The memory device according to claim 1, further comprising:
   an insulator film between the first conductor layer and the first semiconductor film and between the second conductor layer and the second semiconductor film.

5. The memory device according to claim 1, wherein, when viewed in the first direction, the first resistance change film, the first semiconductor film, and the first conductor film are concentrically provided.

6. The memory device according to claim 1, wherein
   the first end of the first conductor film is aligned with the first resistance change film in the first direction,
   the first end of the first conductor film is aligned with the first semiconductor film in the second direction,
   the second end of the first conductor film is aligned with the second resistance change film in the first direction, and
   the second end of the first conductor film is aligned with the second semiconductor film in the second direction.

7. The memory device according to claim 1, wherein
   the first end of the first conductor film is at a same height along the first direction as the first conductor layer, and
   the second end of the first conductor film is at a same height along the first direction as the second conductor layer.

8. The memory device according to claim 1, wherein the first semiconductor film and the second semiconductor film are separated from each other in the first direction.

9. The memory device according to claim 1, wherein the first resistance change film and the second resistance change film are separated from each other in the first direction.

10. The memory device according to claim 1, further comprising:
    a control circuit that, during an operation of changing a resistance value of the second resistance change film, applies a first voltage to the first conductor layer and a second voltage lower than the first voltage to the second conductor layer.

11. The memory device according to claim 1, wherein
    the first and second conductor layers are in a stacked body including a plurality of conductor layers spaced apart from each other in the first direction, and
    the first semiconductor film, the second semiconductor film, the first resistance change film, the second resistance change film, and the first conductor film are on a memory pillar extending in the first direction through the stacked body.

12. The memory device according to claim 11, wherein
    the memory pillar includes a first core film at a first end of the memory pillar, and a second core film at a second end of the memory pillar, and
    the first and second core films are different insulating materials.

13. The memory device according to claim 12, wherein a select transistor is formed at the second end of the memory pillar at a position along the first direction corresponding to the second core film.

14. A memory device, comprising:
    a stacked body comprising a plurality of conductor layers spaced apart from each other in a first direction, the plurality of conductors including a first conductor layer adjacent to a second conductor layer in the first direction with an insulating material therebetween; and
    a memory pillar extending through the stacked body in the first direction, the memory pillar including:
      a first semiconductor film separated from the first conductor layer in a second direction intersecting the first direction;
      a second semiconductor film separated from the second conductor layer in the second direction;
      a first resistance change film separated from the first conductor in the second direction, the first semiconductor film being between the first resistance change film and the first conductor layer in the second direction;
      a second resistance change film separated from the second conductor in the second direction, the second semiconductor film being between the second resistance change film and the second conductor layer in the second direction; and
      a first conductor film having a first end in contact with the first semiconductor film and the first resistance change film and a second end in contact with the second semiconductor film and the second resistance change film.

15. The memory device according to claim 14, wherein the first conductor film is nickel silicide or nickel disilicide.

16. The memory device according to claim 15, wherein the first semiconductor film and the second semiconductor film comprise silicon.

17. The memory device according to claim 14, wherein, the first resistance change film, the first semiconductor film, and the first conductor film are concentrically provided in the memory pillar.

18. The memory device according to claim 14, wherein
    the first end of the first conductor film is at a same height along the first direction as the first conductor layer, and
    the second end of the first conductor film is at a same height along the first direction as the second conductor layer.

19. The memory device according to claim 17, wherein the memory pillar includes a first core film at a first end of the memory pillar, and a second core film at a second end of the memory pillar, and
the first and second core films are different insulating materials.

20. The memory device according to claim 19, wherein a select transistor is formed at the second end of the memory pillar at a position along the first direction corresponding to the second core film.

* * * * *